United States Patent [19]

Podkowa

[11] Patent Number: 5,003,501

[45] Date of Patent: Mar. 26, 1991

[54] PRECHARGE CIRCUITRY AND BUS FOR LOW POWER APPLICATIONS

[75] Inventor: Bill Podkowa, Plano, Tex.

[73] Assignee: Dallas Semiconductor Corporation, Dallas, Tex.

[21] Appl. No.: 371,571

[22] Filed: Jun. 26, 1989

Related U.S. Application Data

[63] Continuation-in-part of Ser. No. 208,889, Jun. 17, 1988, Ser. No. 208,891, Jun. 17, 1988, Ser. No. 203,424, Jun. 7, 1988, and Ser. No. 208,890, Jun. 17, 1988.

[51] Int. Cl.⁵ .................. G06F 13/00; G06F 13/38
[52] U.S. Cl. .................. 364/569; 364/200; 364/900; 368/10
[58] Field of Search ............... 364/200, 900, 569, 707, 364/705.07, 705.08; 368/10, 107, 109

[56] References Cited

U.S. PATENT DOCUMENTS

| | | | |
|---|---|---|---|
| 3,973,110 | 8/1976 | Rode et al. | 364/705.07 |
| 4,217,654 | 8/1980 | Ebihara et al. | 364/705.07 |
| 4,238,832 | 12/1980 | Tsuzuki et al. | 364/705.07 |
| 4,348,743 | 9/1982 | Dozier | 364/569 |
| 4,387,420 | 6/1983 | Singhi et al. | 364/569 |
| 4,396,293 | 8/1983 | Mizoguchi | 364/569 |
| 4,424,567 | 1/1984 | Yasutake | 364/705.08 |
| 4,602,347 | 7/1986 | Koyama | 364/569 |
| 4,677,541 | 6/1987 | Singhi | 364/569 |
| 4,851,987 | 7/1989 | Day | 364/707 |
| 4,891,776 | 1/1990 | Kuroki et al. | 364/705.07 |

OTHER PUBLICATIONS

DS1215 Preliminary Data Sheet from 1987 Data Book of Dallas Semiconductor.

*Primary Examiner*—Kevin J. Teska
*Attorney, Agent, or Firm*—Worsham, Forsythe, Sampels & Wooldridge

[57] ABSTRACT

A low-power integrated circuit clock/calendar, wherein separate data busses are used for the time data and the alarm data. Conditional logic is used to only compare seconds bits (unless a match occurs, in which case higher-order bits are then compared). Thus, charging and discharging of the data busses (which carry the time data) occurs only when a data transition is occurring. A special clocked latch circuit is used to hold the potential of each line of the time data bus constant, except when the data on the bus is actually changing. These innovations help to provide extremely long battery lifetime, since charge is not consumed by unnecessarily charging and discharging busses. Preferably this bus architecture is combined with a low-power logic architecture.

23 Claims, 15 Drawing Sheets

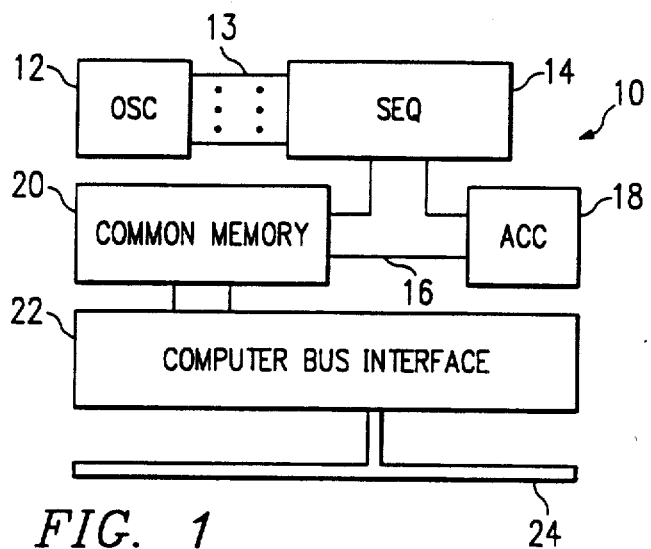
FIG. 1
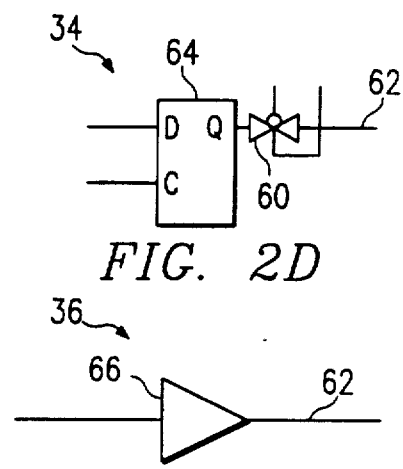
FIG. 2D
FIG. 2E
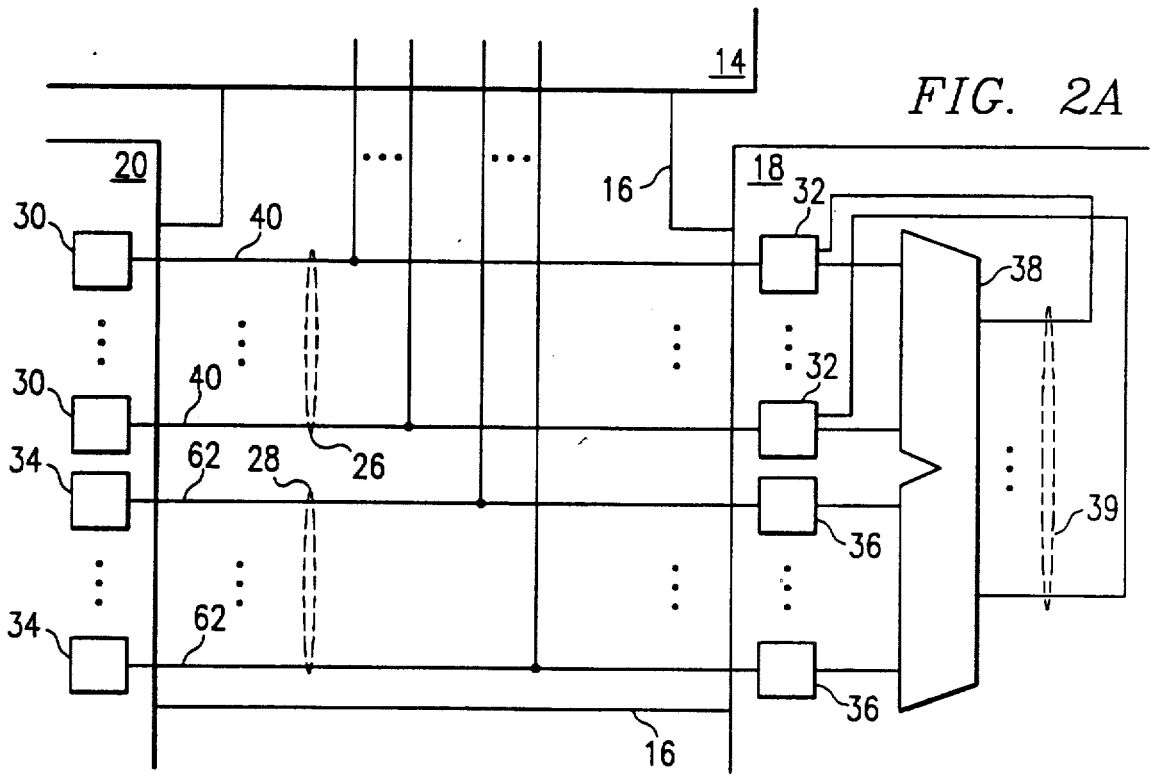
FIG. 2A
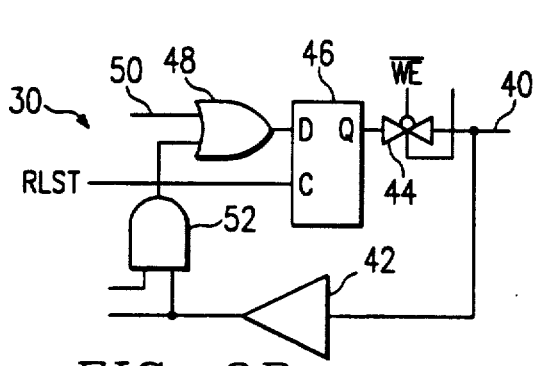
FIG. 2B
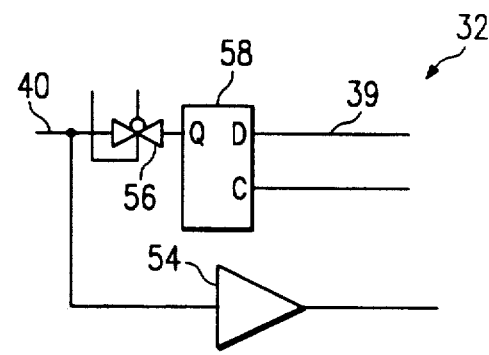
FIG. 2C

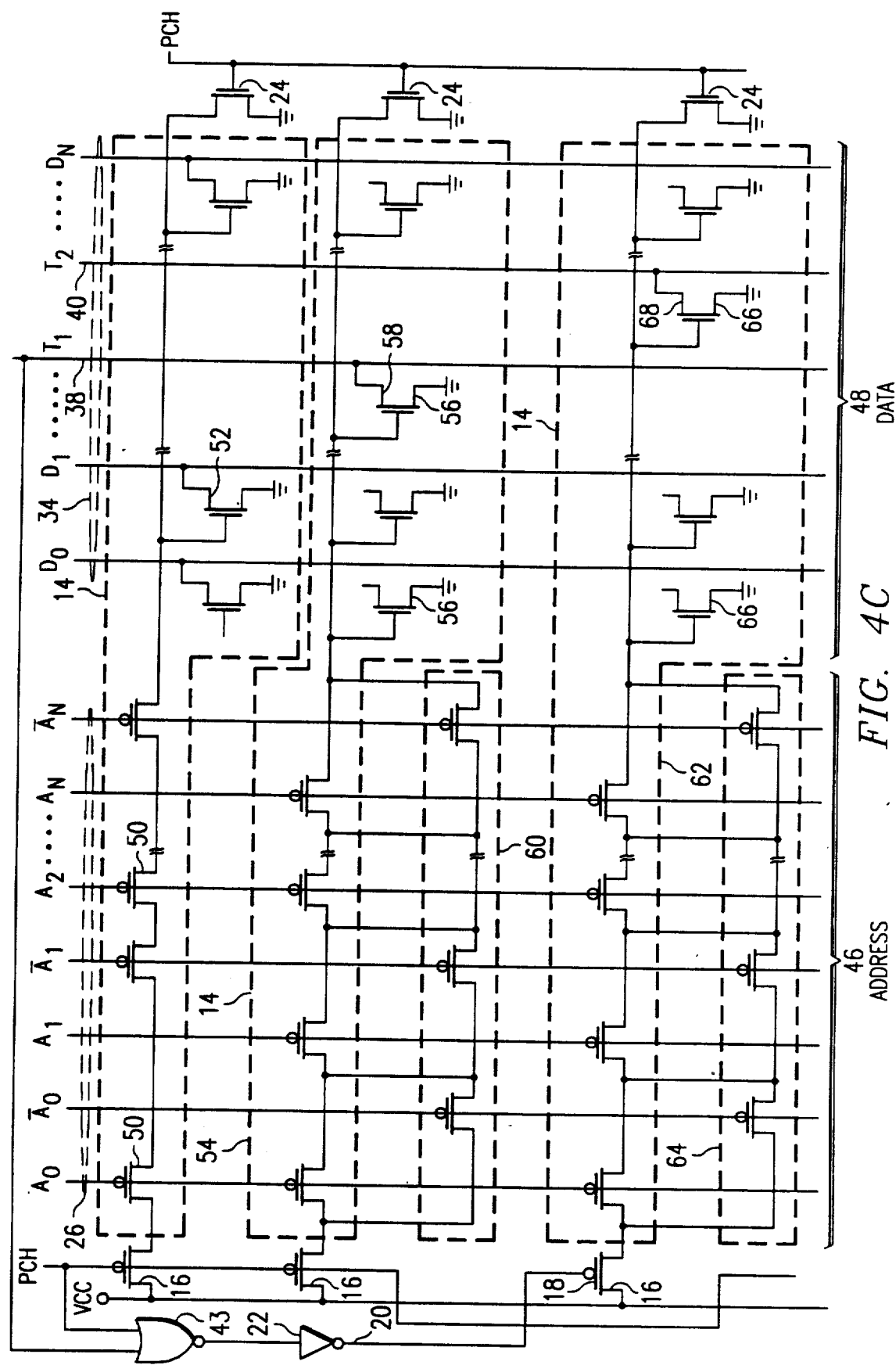

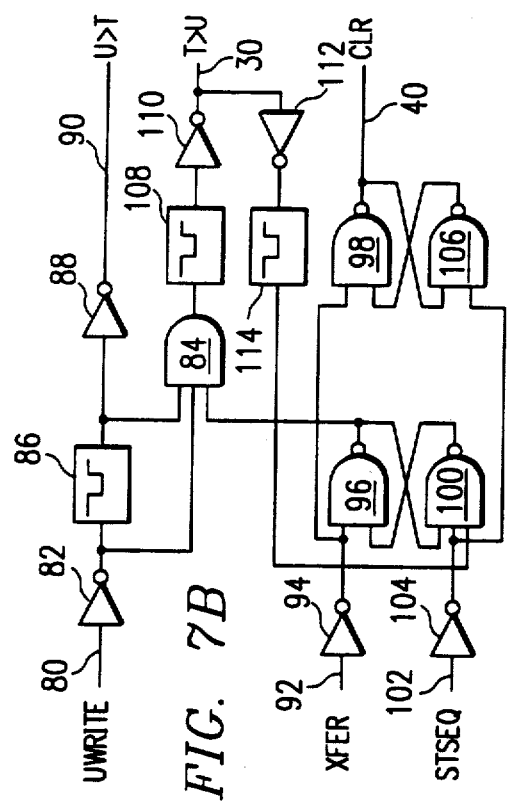
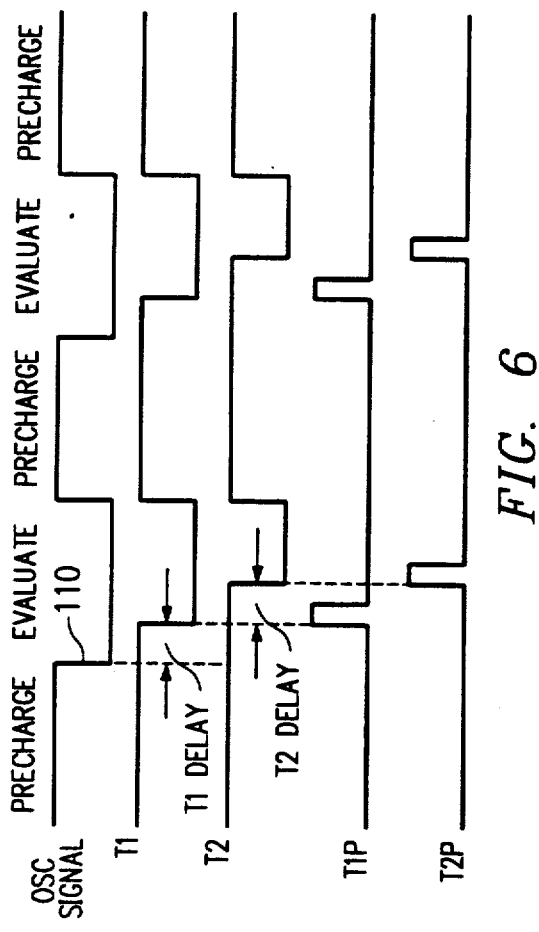
FIG. 7B
FIG. 6
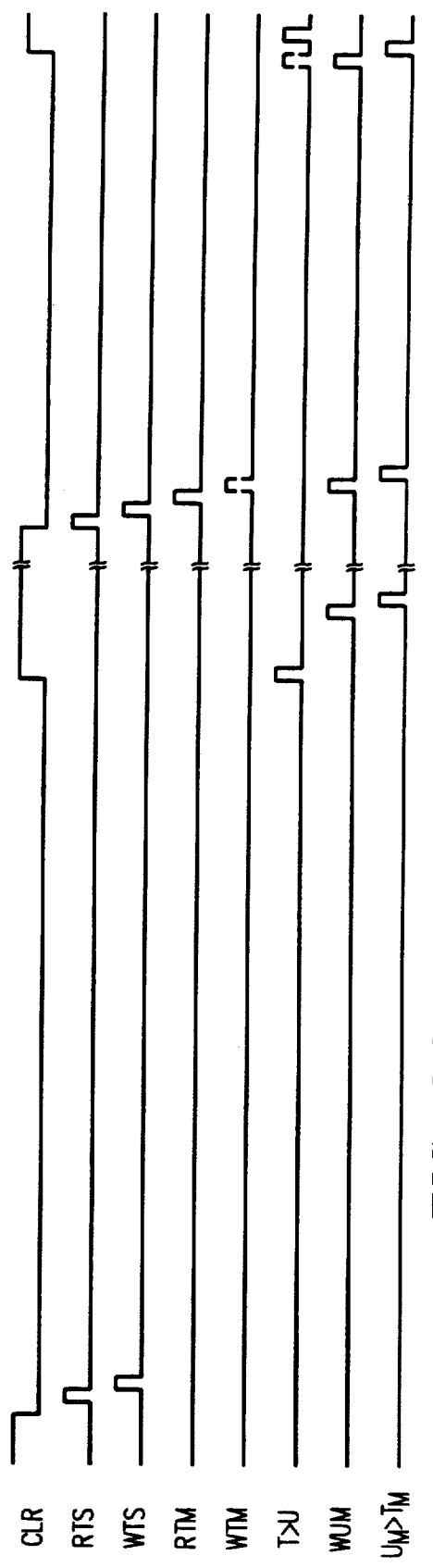
FIG. 7C

PRECHARGE CIRCUITRY AND BUS FOR LOW POWER APPLICATIONS

CROSS-REFERENCE TO OTHER APPLICATIONS

U.S. patent application Ser. No. 208,889, filed Jun. 17, 1988, entitled "LOW POWER TIMEKEEPING SYSTEM"; of Ser. No. 208,891, filed Jun, 17, 1988, entitled "DYNAMIC PLA TIME CIRCUIT"; of Ser. No. 203,424, filed Jun. 7, 1988, entitled "DUAL STORAGE CELL MEMORY"; and of Ser. No. 208,890, filed Jun. 17, 1988, entitled "ARBITRATION OF DATA WRITTEN INTO A SHARED MEMORY". Each of the claims of the present application is believed to be fully supported by the text in a single parent application, but the present application is being presented as a continuation-in-part in order to better highlight the claimed invention, and also to combine text from multiple parent applications.

BACKGROUND AND SUMMARY OF THE INVENTION

The present application pertains to timekeeping circuits and, more particularly, to low power timekeeping circuits.

Most computers include a timekeeping module or system which keeps track of the present time of day and date using its own oscillator. These timekeeping systems receive their primary power from the computer system but have backup batteries in order to preserve the time data when the primary power source fails. Since the useful life of the backup battery depends generally on the amount of current drawn by the timekeeping system, the power supply current used by the timekeeping system generally determines how often battery replacement is required. Therefore it can be appreciated that a timekeeping system which operates with a relatively small amount of power supply current is highly desirable.

The disclosed innovations provide a timekeeping system which requires only a relatively small amount of power supply current.

In the preferred embodiment, the timekeeping chip keeps time by a process of:

(1) reading seconds data from a memory, incrementing the seconds data, and storing the incremented seconds data back into the memory.

(2) If the seconds data, before being incremented, was 59 seconds, then the minutes data is read, incremented, and the incremented minutes data is stored in the memory.

(3) If the minutes data, prior to being incremented, was at 59 minutes, then the hours data is read from the memory, incremented, and the incremented hours data is stored back into the memory.

In the present invention, this method is combined with an innovative circuit architecture. Separate busses are used for the time data and for the alarm data. This allocation of functions to separate busses has been found to have substantial advantages of power consumption.

This provides a software-based timing operation wherein the power-consumption is extremely low. On the time bus, the higher-order (minutes etc.) data is not fetched unless the time seconds data is 59, or matches the alarm seconds data. Therefore, during 58 of every 60 seconds, the data is merely incremented, so that the higher-order bits may or may not change. Similarly, the data on the alarm bus remains constant for 59 seconds out of every 60. Thus, charge consumption due to charge and discharge cycles is minimized.

It should be noted that the disclosed data bus architecture also cooperates advantageously with the disclosed ratioless programmable array logic. This array logic, in the presently preferred embodiment, provides "break-before-make" operation, which avoids through currents.

The preferred embodiment provides a timekeeping system which includes a sequencer, a memory, and an accumulator connected together by a data bus. The stored seconds data is outputted onto the data bus from the memory, and read by the accumulator. The accumulator increments the seconds data and writes the incremented seconds data onto the data bus. The incremented seconds data is stored in the memory, and the memory holds the incremented seconds data on the data bus until at least a next read operation by the memory or a next write operation by the accumulator.

BRIEF DESCRIPTION OF THE DRAWING

The present invention will be described with reference to the accompanying drawings, which show important sample embodiments of the invention and which are incorporated in the specification hereof by reference, wherein:

FIG. 1 is a block diagram of a timekeeping system according to the present invention;

FIG. 2 (comprising FIGS. 2A–2E) is a logic diagram of the data bus interface circuitry for the sequencer, accumulator, and common memory of FIG. 1;

FIG. 4C is a schematic diagram of a portion of the PLA matrix showing a timing circuit according to the present invention.

FIG. 6 is a timing diagram of certain signals in the timekeeping system of FIG. 1. It should be appreciated that for purposes of clarity the timing signals shown in FIG. 6 have not necessarily been drawn to scale in order to more clearly show timing relationships in the preferred embodiment of the present invention.

FIG. 7B is a logic diagram of a portion of the sequencer of FIG. 1, showing the additional arbitration circuitry preferably used; and FIG. 7C is a timing diagram for use in describing the operation of the preferred system.

DESCRIPTION OF THE PREFERRED EMBODIMENTS

Figure 3A:
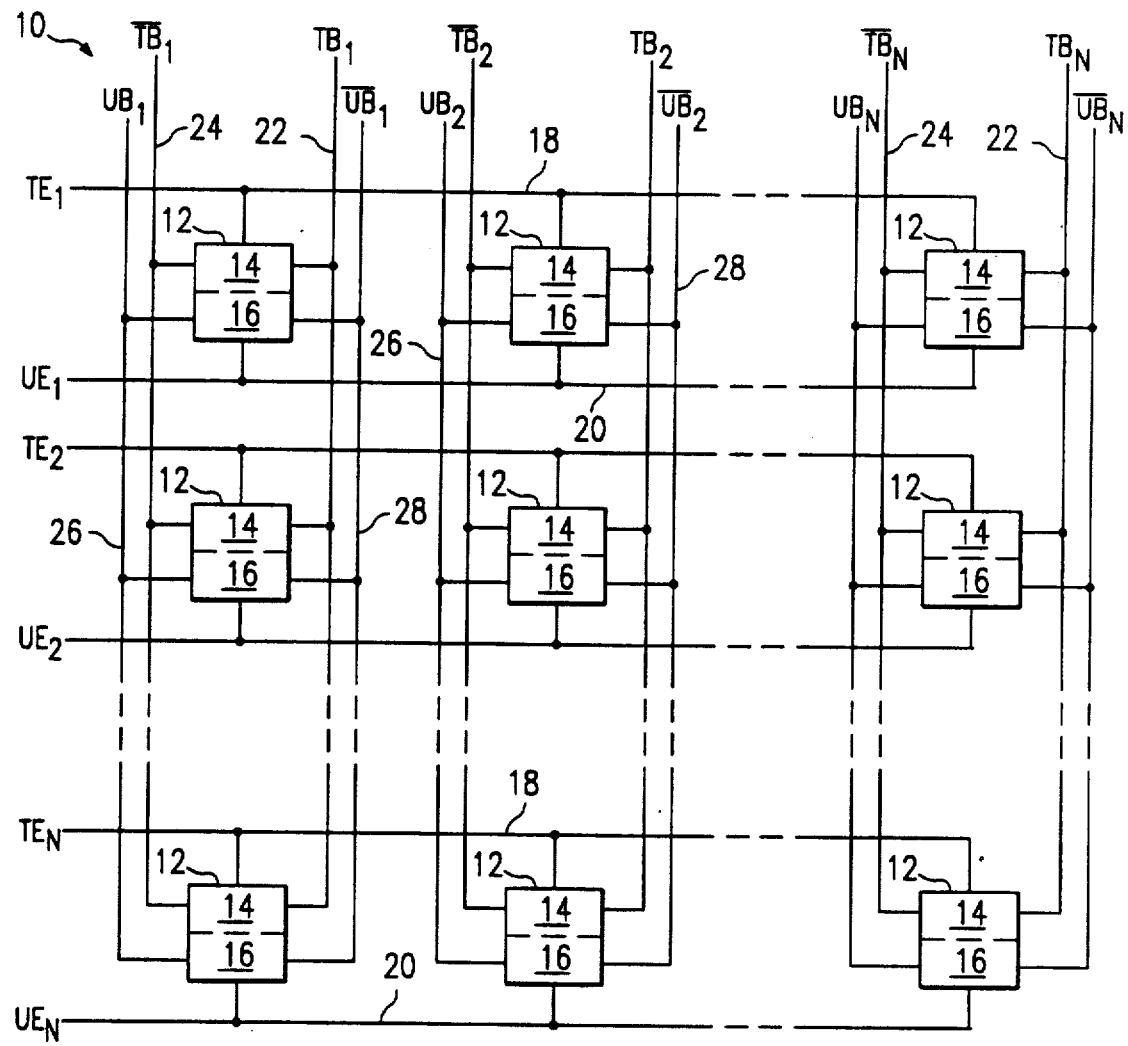
FIG. 3A is a block diagram of the preferred version of the memory array.

The numerous innovative teachings of the present application will be described with particular reference to the presently preferred embodiment, wherein these innovative teachings are advantageously applied to the particular problems of a low-power-CMOS clock/calendar integrated circuit. However, it should be understood that this class of embodiments provides only a few examples of the many advantageous uses of the innovative teachings herein. In general, statements made in the specification of the present application do not necessarily delimit *any* of the various claimed inventions. Moreover, some statements may apply to some inventive features but not to others.

TWO-BUS ARCHITECTURE

A timekeeping system according to the preferred embodiment of the present invention consists primarily of an oscillator, a sequencer, a memory, and an accumulator. Various signal lines connect the major blocks of circuitry listed above, and the sequencer, memory, and accumulator are also connected by two data buses, an A data bus and a B data bus.

In operation a clock line from the oscillator to the sequencer is usually at a logic 1 level, but becomes a pulse train for a period of time at one second intervals. The sequencer is a state machine which performs an update cycle each second. The update cycle consists of two segments, an update sequence for updating the time stored in the memory, and an alarm sequence for comparing the present time to alarm data stored in the memory. When the clock signal into the sequencer transitions to a logic 0 level to begin the pulse train, the sequencer begins the update cycle by performing first the update sequence. The update sequence consists of reading the seconds data from the memory, testing the seconds data to see if it reads 59 seconds, incrementing the seconds data and writing the incremented seconds data back to the memory. If the seconds data was not 59 seconds, then the sequencer enters into the alarm sequence. If the seconds data was 59 seconds, then the minutes data is read, incremented, and written back into the memory. If the minutes data was not 59 minutes, then the sequencer enters into the alarm sequence, and if the minutes data was 59 minutes, then the sequencer reads hours. In a similar manner the sequencer, as required, updates the hours, days of the week, date of the month, month, and year data stored in the memory.

When the sequencer enters the alarm sequence, the present seconds data is compared to the alarm seconds data and if a match is not found the sequencer sends a signal to the oscillator to hold the clock line at a logic 1 level. If a match is found, then the minutes alarm data is compared to the minutes present time data. If a match is found then the hours alarm data is compared to the hours present time data. If an hour match is found then a signal is sent from the sequencer indicating that the alarm match has been made. At this point the sequencer again sends a signal to the oscillator to hold the clock line at a logic 1 level.

The A data bus is used to transfer the present time data between the sequencer in the memory and the accumulator. The B data bus is used either to provide a second number to the accumulator from the sequencer or to transfer the alarm data from the memory to the accumulator. Since in the majority of the times the sequencer will read the seconds data and increment the seconds data and then enter into the alarm sequence in which the seconds data is reread to be compared to the alarm seconds data, the data on the A bus usually changes state only once per update cycle thereby saving the power supply current which would be required to charge and discharge the lines of the A data bus several times during each update.

The disclosed innovative teachings refer to certain lines as being in one data bus, and certain other data lines as being in the other data bus; but it will be recognized by those skilled in the art that the disclosed teachings may be translated directly into statements about how the data lines are operated, rather than into statements about which lines belong to which busses. Thus, the disclosed innovative teachings could be advantageously adapted to other systems without necessarily accepting the conceptualization of the bus architecture as including two busses.

The timekeeping system of the present invention advantageously saves power by sequencing only as far in the update cycle and the alarm cycle as is needed during each update cycle and being inactive during the rest of the one second interval, therefore requiring only a small amount of power supply current. Thus, the electrical energy required for each update cycle varies with the amount of time data required to be updated. Also, the sequencer in the preferred embodiment uses a PLA array of ratioless logic which provides a low power state machine. Moreover, since the A data bus usually only changes once and the B data bus usually stays at the same logic state during each update cycle, the amount of current required to charge and discharge these data buses is minimal for each update cycle on the average.

SYSTEM OVERVIEW

Turning now to the drawings, FIG. 1 is a block diagram of the timekeeping system 10 of the presently preferred embodiment. The timekeeping circuit 10 includes an oscillator 12. The oscillator 12 provides timing signals to the sequential logic 14. The sequential logic 14 is connected on a bus 16 to an accumulator 18 and to a common memory 20. The common memory 20 is connected to a computer bus interface 22 which in turn is connected to a computer bus 24 of the general purpose computer.

The timekeeping circuit 10 in the preferred embodiment operates by sequentially reading the time data stored in the common memory 20, updating the time data in the accumulator 18 and writing the updated time into the common memory 20. The computer bus interface 22 allows the user through the computer bus 24 to read and write the time data in the common memory 20.

More specifically, the oscillator 12 provides a clock signal to the sequencer 14 which changes from a logic 1 level to a pulse train once a second. The sequencer 14, upon receipt of the pulse train first reads the seconds data in the common memory 20, increments the seconds data in the accumulator 18, and then rewrites the incremented seconds data into the common memory 20. The sequencer 14 also detects if the seconds data is at 59 seconds prior to the update. If the seconds data is at 59 seconds prior to being incremented, then the sequencer, after the seconds data is written into the common memory 20, reads the minutes data in the common memory 20 and increments and writes the minutes data. In a similar manner, the hours, the day of the week and day of the month, the month, and the year are updated as required. At the end of the update cycle, the sequencer 14 in the preferred embodiment reads seconds alarm data and seconds time data and the two numbers are compared to each other in the accumulator 18 to determine if they match. If there is a match, then the minutes alarm data and the minutes time data are read and compared. If the minutes also match, then the hours alarm data and the hours time data are read and compared. If the two sets of hours data match, the sequencer 14 provides a signal to the computer bus interface 22 that an alarm match has been found. Any time a match is not found, the alarm sequence is terminated. At the end of the alarm sequence, the sequencer 14 sends a signal to the oscillator 12 to hold the clock signal to the sequencer 14 at a logic 1 level where it stays until the next update cycle is to begin at which time the oscillator 12 again provides a pulse train clock signal to the sequencer 14.

Operating asynchronously to the timekeeping circuit 10, the computer through the computer bus 24 is able to read and write the time data in the common memory 20. However, a collision can occur if the computer is trying to write data into the common memory 20 at the same time that the sequencer 14 is reading or writing data from or to the common memory 20. The arbitration circuitry of the present invention enables this asynchronous writing into the common memory 20 to ensure that the data in the common memory data is not corrupted during a write cycle by the user or by the timekeeping circuit 10.

BUS ARCHITECTURE

FIG. 2A is a block diagram of the system bus 16 which includes an A data bus 26 and a B data bus 28. The A data bus includes 8 data lines (individually labelled, in FIGS. 2B and 2C, as lines 40), and the B data bus also includes 8 data lines (individually labelled, in FIGS. 2D and 2E, as lines 62). Both the A data bus 26 and the B data bus 28 are connected to the sequencer 14, the accumulator 18, and the common memory 20. Each of the eight data lines 40 of the A data bus 26 is connected to an interface circuit 30 inside the common memory 20, to an interface circuit 32 in the accumulator 18, and to one of the address lines of a PLA array in the sequencer 14. Each of the eight data lines 62 of the B data bus 28 is connected to an interface circuit 34, in the common memory 20, to an interface circuit 36 in the accumulator 18, and to one of eight data lines in the PLA array inside the sequencer 14. The accumulator 18 includes an ALU circuit 38, the output of which on lines 39 is fed back into the interface circuits 32 (which interface to the A bus).

LATCHING INTERFACE OF A DATA BUS TO MEMORY

FIG. 2B is a logic diagram of the interface circuit 30 wherein one of the eight data lines 40 of the A data bus 26 is connected to the input of an input buffer 42 and also to one of the data terminals of a transmission gate 44. The control terminals of the transmission gate 44 are connected to complementary control signals which enable or disable the transmission gate 44. The other signal terminal of the transmission gate 44 is connected to the Q output of a D latch 46. The D latch 46 receives a clock signal from inside the common memory 20. The D input of the D latch 46 is connected to the output of an OR gate 48, one input of which is connected to a data line 50 in the common memory 20. The second input of the OR gate 48 is connected to the output of an AND gate 52. One input of the AND gate 52 is connected to the output of the buffer circuit 42. The output of the buffer circuit 42 provides one data input line to the common memory 20. The second input of the AND gate 52 is connected to a control signal inside the common memory 20.

The interface circuit 30 operates during a memory read operation by latching the data on a data line 50 into the D latch 46 while the output of the AND gate 52 is held at a logic 0 level. The Q output of the D latch 46 is passed through the transmission gate 44 onto the A bus 26. During a memory write operation the transmission gate 44 is made nonconductive and the data on line 40 is passed through the buffer 42 to write circuitry inside the common memory 20. Also during a memory write operation, the data at the output of the buffer 42 is passed through the AND gate 52 and the OR gate 48 and latched into the D latch 46. After the memory write operation, the transmission gate 44 is made conductive so that the common memory 20 is holding the data on the A bus 26 which was just previously written into the common memory 20.

OTHER DATA BUS INTERFACES

The interface circuit 32 in FIG. 2C includes a buffer 54, a transmission gate 56, and a D latch 58 which are configured like the buffer 42, the transmission gate 44, and the D latch 46 of FIG. 2B. However, the interface circuit 32 does not include the OR gate 48 or the NAND gate 52 of F Similarly, the interface circuit 34 shown in FIG. 2D includes a transmission gate 60, one signal input of which is connected to one line 62 of the B data bus 28. The other signal input of the transmission gate 60 is connected to the Q output of a D latch 64 which receives data from the common memory 20 at the D input of the D latch 64 and also receives a clock signal at the clock input of the D latch 64. Thus, the interface circuit 34 is able to provide data onto the B data bus 28, but not to read data from the B data bus.

The interface circuit 36 as shown in FIG. 2E includes only a buffer circuit 66 for receiving data from the B data bus 28.

PREFERRED MEMORY 20

The common memory 20 includes an array of dual memory cells as described below, and in the aforementioned related application entitled DUAL STORAGE CELL MEMORY and incorporated herein by reference.

ARRAY ORGANIZATION

The memory system of the presently preferred embodiment permits two asynchronous systems to both write data into the memory and read data from the memory. That is, this embodiment provides a shared memory system which can be used (in the context of the preferred embodiment, or in other contexts) to permit two asynchronous system to both write data into the memory and read data from the memory. This capability, of itself, is highly advantageous.

Shown in an illustrated embodiment is a memory which includes first and second memory cells, each memory cell having a first and second data node. The memory includes first circuitry coupled to the first and second data nodes of the first memory for transferring data into and out of the first memory independent of the data stored in the second memory cell and includes second data transfer circuitry coupled to the first and second data nodes of the second memory cell for transferring data into and out of the second memory cell independent of the data stored in the first memory cell. The memory also includes third data transfer circuitry separate from the first and second data transfer circuitry. The third data transfer circuitry is coupled to the first and second data nodes of both the first and second memory cells and operates to transfer data between the first and second memory cells.

Also shown in an illustrated embodiment of the invention is a memory array which includes a plurality of memory cells arranged in rows and columns. Each of the memory cells includes a first and second storage cell wherein each of the first storage cells has a first enable line and a first pair of true and complementary bit lines and each of the second storage cells has a second enable line and a second pair of true and complementary bit lines. Each of the first enable lines of each row of the memory cells are coupled together to form a common first enable line for each row of the memory array and each of the second enable lines of each row of the memory cells are coupled together to form a common second enable line for each row of the memory array. Also, each of the first pair of true and complementary bit lines of each column of the memory array are coupled together to form a common first pair of true and complementary bit lines for each column, and each of the second pair of true and complementary bit lines of each column of the memory array are coupled together to form a common second pair of true and complementary bit lines for each column.

MEMORY CELL ARCHITECTURE

The memory array of the preferred embodiment has a plurality of dual storage cells arranged in rows and columns. Each of the dual storage cells has a first memory cell, referred to as a timekeeping memory cell in the preferred embodiment, and a second memory cell, referred to as a user memory cell. Each of the first and second memory cells has separate pairs of true and complementary bit lines which are common to all of the first memory cells in each column of the memory array. Similarly, each of the second memory cells is coupled to a second pair of true and complementary bit lines which are common to each of the second memory cells in each column of the array. Each of the first memory cells has an enable line connected thereto which is shared by each of the first memory cells in each row of the array, and each of the second memory cells has a second enable line which is shared by each of the second memory cells in each row of the array.

In the preferred embodiment both the first and second memory cells are six-transistor static RAM cells which are well known to those skilled in the art. Each of the data cells has a first enable transistor which couples one of the bit lines, for example the true bit line, to a first data node inside the memory cell and a second enable transistor which couples the other bit line, the complementary bit line in this example, to the second data node inside the memory cell. The dual storage cell according to the present invention also includes data transfer circuitry for transferring the data directly between the first memory cell and the second memory cell. More specifically, four sets of series connected n-channel transistors connect each of the data nodes of the two memory cells to ground. The gate of one of these transistors in each of the four sets is connected to an external signal to enable the data transfer from one of the memory cells to the other, and the gate of the second transistor is connected to the opposite data node of the opposite memory cell. For example, the first data node of the first memory cell is coupled to ground through the series connection of two n-channel transistors. One of these n-channel transistors is driven by an external signal which will transfer the data from the second memory cell to the first memory cell, and the gate of the second transistor is connected to the second data node of the second memory cell. Similarly, the second data node of the first memory cell is coupled to ground through two n-channel transistors one of which is driven by the external signal and the other is gated by the voltage at the first data node of the second memory cell.

In operation when data is to be transferred from the second memory cell to the first memory cell, the external signal activates or makes conductive one of the two series transistors connected between the data nodes of the first memory cell and ground. If the first data node of the second memory cell is at a logic 1 level, then the second data node of the first memory cell will be pulled to ground since both of the series transistors connected between the second data node of the first memory cell will be conducting. Since the data nodes of the cell are complementary, in this example the second data node of the second memory cell will be at a logic 0 level and, therefore, the first data node of the first memory cell will be isolated from ground. This grounding of the second data node of the first memory cell forces the memory cell to assume a logic condition in which the first data node is at a logic 1 level and the second data node is at a logic 0 level. Thus, by the application of the external transfer signal, the data has been transferred from the second memory cell to the first memory cell without activating the enable transistors coupled between the data nodes and the bit lines.

Turning now to the drawings, FIG. 3A is a block diagram of a memory array 310 which contains a plurality of dual storage cells 312 according to the present invention. Each of the dual storage cells 312 includes a first memory cell 314 and a second memory cell 316. The dual storage cells 312 are arranged in rows and columns as shown in FIG. 3A. The upper memory cells 314 of each of the dual storage cells 312 is enabled by an enable line 318 which is shown as TE in FIG. 3A. Similarly, each of the lower memory cells 316 is enabled by an enable line 320 shown as UE in FIG. 3A. The upper memory cell 314 has connected to it a true bit line 322 shown as TB and a complementary bit line 324 shown as TB*. Similarly, the lower memory cell 316 has connected to it a true bit line 326 shown as UB and a complementary bit line 328 shown as UB*.

Figure 3B:
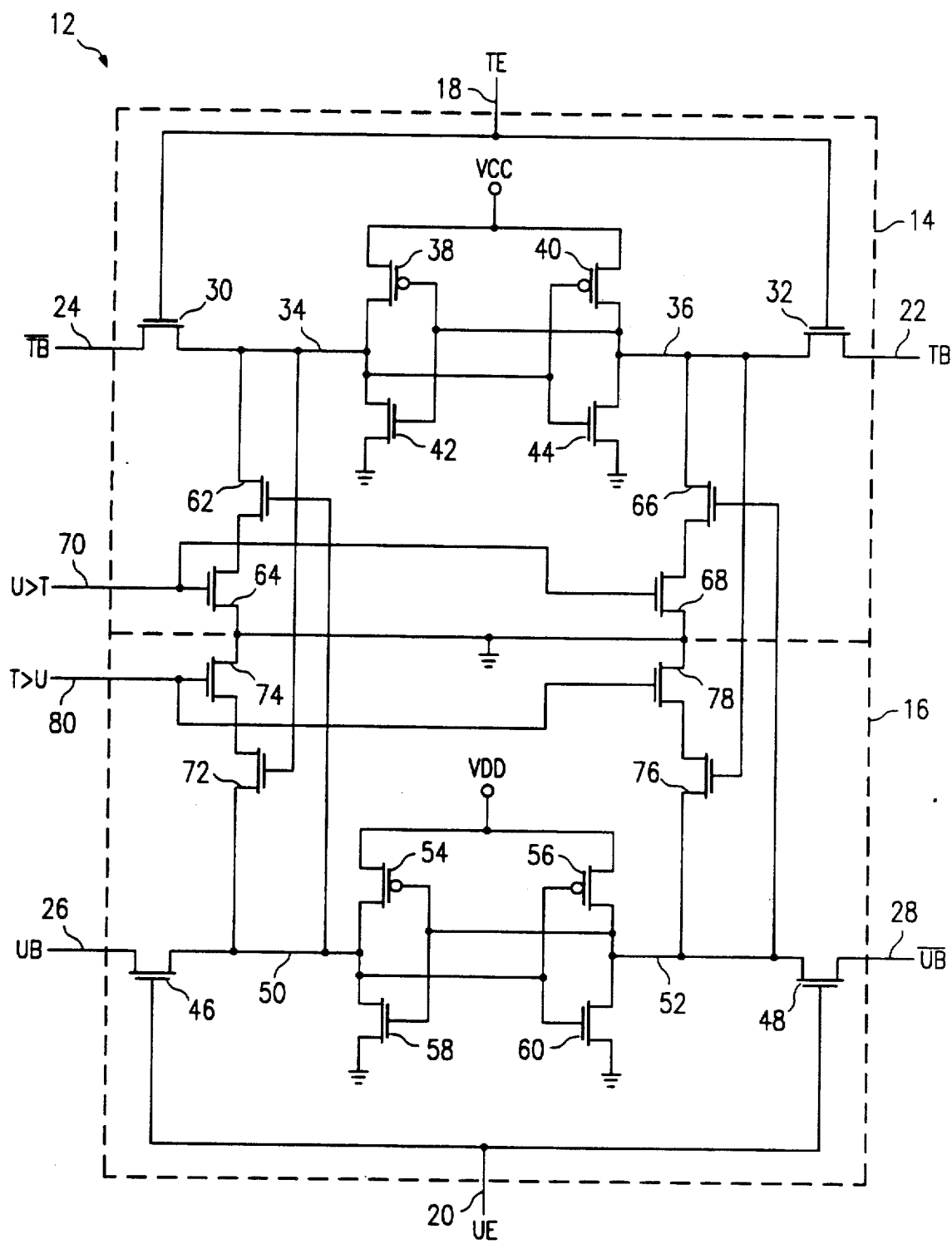
FIG. 3B is a schematic diagram of a dual storage cell preferably used in the array of FIG. 3A.

A dual storage cell 312 is shown in detail in FIG. 3B. The upper memory cell 314 includes two enable transistors 330 and 332 which are gated by the TE line 318, the source of the enable transistor 330 is connected to the TB* line 324, and the drain of the enable transistor 330 is connected to a first data node 334 of the upper memory cell 314. The source of the enable transistor 332 is connected to the TB line 322 and the drain of the enable transistor 332 is connected to a second data node 336 of the upper memory cell 314. Coupled between the data nodes 334 and 336 are four transistors, two p-channel transistors 338 and 340 and two n-channel transistors 342 and 344, which are connected as cross coupled inverters in a standard six-transistor configuration.

The lower memory cell 316 also contains two enable transistors, a first enable transistor 346 and a second enable transistor 348. The gates of the enable transistors 346 and 348 are connected together and to the enable signal UE on line 320. The source of the enable transistor 346 is connected to the UB bit line 326 and the drain of the enable transistor 346 is connected to a first data node 350 of the lower memory cell 316. The source of the enable transistor 348 is connected to the UB* bit line 328 and the drain of the enable transistor 348 is connected to a second data node 352 of the lower memory cell 316. Connected between the first data node 350 and the second data node 352 are four transistors, two p-channel transistors 354 and 356 and two n-channel transistors 358 and 360. The four transistors 354, 356, 358, and 360 form two inverters in a standard six-transistor configuration.

The upper memory cell 314 also contains data transfer circuitry consisting of two sets of two n-channel transistors, each set connected between one data node 334 or 336, and ground. More specifically, a first n-channel transistor 362 has its drain connected to the first data node 334 and its source connected to the drain of a second n-channel transistor 364, the source of which is connected to ground. Similarly, another n-channel transistor 366 has its drain connected to the second data node 336 and its source connected to the drain of another n-channel transistor 368, the source of which is connected to ground. The gates of the n-channel transistors 364 and 368 are connected together and to a signal labeled U>T on a line 370. The gate of the n-channel transistor 362 is connected to the first data node 350 of the lower memory cell 316 and the gate of the n-channel transistor 366 is connected to the second data node 352 of the lower memory cell 316.

In a complementary manner, the first and second data nodes of the second memory cell are each connected through a series path of two n-channel transistors to ground. More specifically, a first n-channel transistor 372 has its drain connected to the first data node 350 and its source connected to the drain of another n-channel transistor 374, the source of which is connected to ground. Another n-channel transistor 376 has its drain connected to the second data node 352 and its source connected to the drain of another n-channel transistor 378, the source of which is connected to ground. The gates of the n-channel transistors 374 and 378 are connected together and are driven by a signal labeled T>U on a line 380. The gate of the n-channel transistor 372 is connected to the first data node 334 of the upper memory cell 314, and the gate of the n-channel transistor 376 is connected to the second data node 336 of the upper memory cell 314.

The U>T signal line 370 and the T>U signal line 380 are not shown in FIG. 3A. In the preferred embodiment the T>U signal line 380 for each of the memory cells 312 is connected together to form a single T>U line for the memory array 310, while there are separate U>T lines for groups of eight memory cells 312 in the memory array 310.

In operation, when the signals U>T and T>U on line 370 and 380 respectively are at a logic 0 level, then the upper memory cell 314 and lower memory cell 316 operate as normal six-transistor static memory cells.

Advantageously, data can be transferred from the upper memory cell 314 to the lower memory cell 316 or from the lower memory cell 316 to the upper memory cell 314 by the application of a single voltage level on the T>U signal on line 380 or the application of the U>T signal on line 370 respectively. More specifically, when data is to be transferred from the upper memory cell 314 to the lower memory cell 316, a logic 1 level on the T>U signal line 380 enables the n-channel transistors 374 and 378. Since the first and second data nodes 334 and 336 of the upper memory cell 314 have complementary data, then one of the n-channel transistors 372 or 376 will be enabled or made conductive and the other will be disabled or made nonconductive. For example, if the first data node 334 is a logic 1 level and the second data node 336 is a logic 0 level, then transistor 372 will be enabled and transistor 376 will be disabled. Under these conditions the first data node 350 of the lower memory cell 316 will be pulled to ground through the n-channel transistor 372 and 374 and the second data node 352 will remain isolated since the n-channel transistor 376 is disabled. This action will transfer the data from the second memory cell to the first memory cell.

Conversely, the data in the lower memory cell 316 can be transferred to the upper memory cell 314 by placing a logic 1 level on the U>T signal line 370 which will enable the n-channel transistor 364 and 368. Since the first and second data nodes 350 and 352 of the lower memory cell 316 have complementary data on them, one of the n-channel transistor 362 and 366 will be enabled and the other will be disabled. Thus, in the same manner as described above, the data in the lower memory cell 316 will be transferred into the upper memory cell 314.

Advantageously, the transfer of data between the two memory cells operates by grounding one of the data nodes of the receiving memory cell without sourcing or sinking current from the other memory cell. Since the ground is available in each of the memory cells and can be coupled through the memory array with a metal line, the present invention allows the data transfer to occur without having to discharge the capacitive charge associated with each of the data nodes through a signal line running through the memory array. Thus, the U>T signal and the T>U signal on lines 370 and 380 can be relatively high impedance lines since they are not used to directly charge or discharge the data nodes of the memory cells.

In the preferred embodiment of the invention these dual memory cells 312 are used in a timekeeping circuit in which the upper memory cell 314 contains data for use by timekeeping circuitry and the lower memory cell 316 holds data for use by a user. Thus, the timekeeping circuitry reads data from the upper memory cells 314 and writes data back into the upper memory cells 314, and the user reads data from the lower memory cell 316 and writes data into the lower memory cell 316. At appropriate times, for example after the timekeeping circuitry updates the upper memory cells 314, the T>U line 380 is brought to a logic 1 level to transfer the updated time from the timekeeping circuitry consisting of the upper memory cell 314 into the user memory consisting of the lower memory cell 316. Similarly, when a user writes new time data into the lower memory cell 316, the signal U>T on line 370 is brought to a logic 1 level to transfer the data from the user section into the timekeeping section. Thus, both the timekeeping circuitry and the user may asynchronously read and write data into their own section of each of the dual memory cells 312 and following either a write operation by the timekeeping circuitry or by the user circuitry, the appropriate data transfer occurs so that the timekeeping memory consisting of the upper memory cells 314 and the user memory consisting of the lower memory cells 316 contains the same data.

MEMORY CELLS WITH DIRECT LOGIC OUTPUTS

Figure 3C:
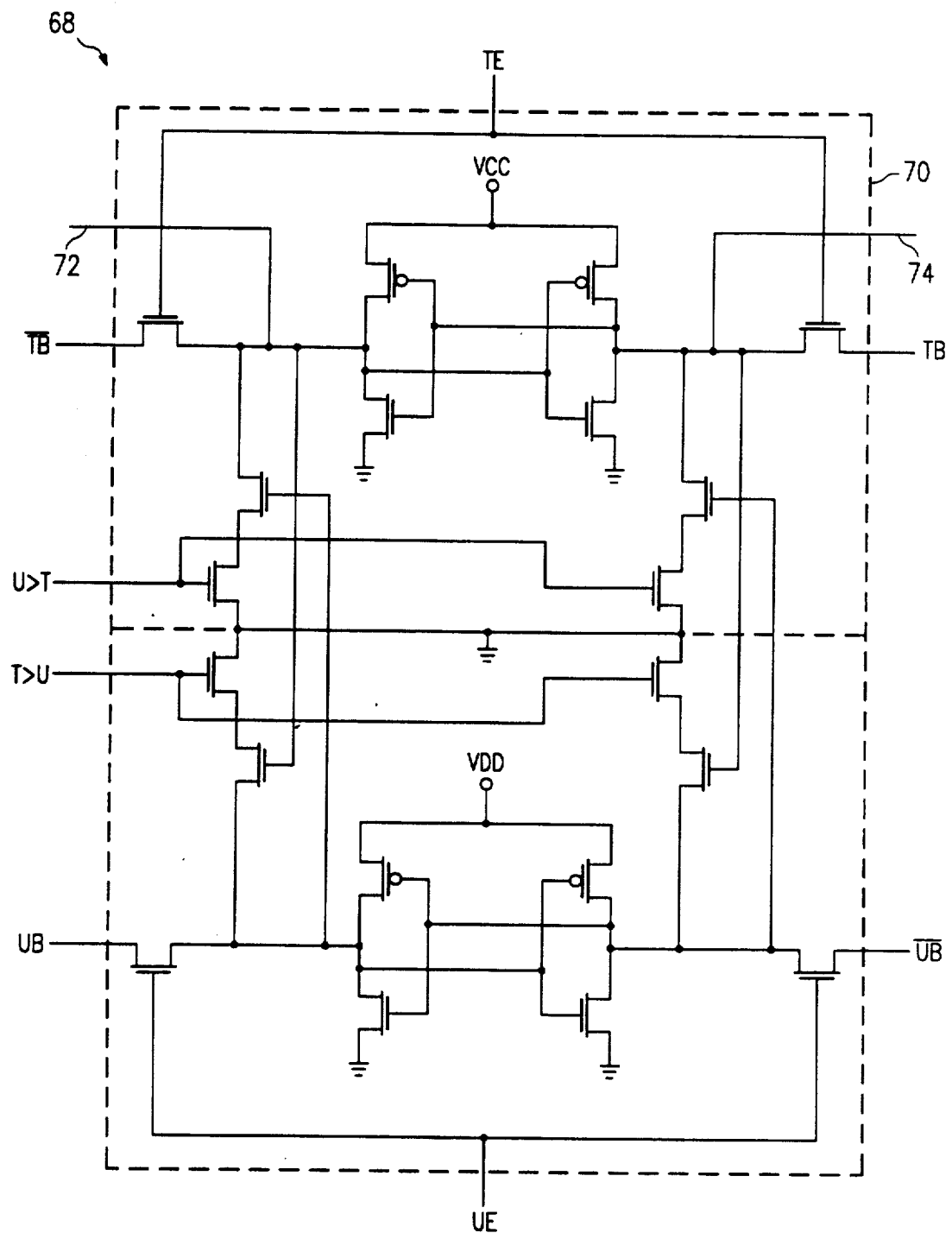
FIG. 3C is a schematic diagram of a modification of the dual memory cell of FIG. 3B.

FIG. 3C is a schematic diagram for the dual memory cell 68 used in a portion of the common memory 20, showing how lines 72 and 74 are brought out of this cell. Each of the lines 72 and 74 is connected to the data nodes inside the six-transistor memory cells of the timekeeping section 70 of the dual memory cell 68. These additional lines 72 and 74 are connected to buffer circuitry (not shown), and this allows data to be read directly out of these cells without requiring a normal read operation in the common memory 20. Thus, the data taken from these memory cells is continuously available. These logic cells shown in FIG. 3C are used in the common memory 20 for those cells storing the day of the week, date of the month, month, and year and are provided to the sequencer 14 on the system bus 16 and used by the sequencer 14 in a manner described below.

AVOIDANCE OF MEMORY ACCESS COLLISIONS

The common memory 20 allows a user to write the present time into the common memory through the computer bus interface 22. As will be described later, other data is also loaded and stored in the common memory 20 through the computer bus interface 22. In order to avoid collisions between the present time entered by the user on the computer bus 24 and the time being written into the common memory by the sequencer 14, arbitration logic is contained within the timekeeping system 10 of the preferred embodiment, as will now be described.

The method and circuitry for arbitrating data being written into a common or shared memory, as practiced in the preferred embodiment, will now be described in detail.

Shown in an illustrated embodiment is a method for storing data from a first system and a second system into a common memory. The method includes writing data from the first system into a first memory section of the common memory and transferring the data from the first memory section to a second memory section of the common memory after data has been written into the first section. The method also includes writing data from the second system into the second memory section if the first system has not written data into the first memory location during the present memory access cycle of the second system. The method also includes transferring data from the second memory section to the first memory section after data has been written into the second memory section.

Preferably the transferring of data from the second memory section to the first memory section is delayed if the first system is writing data into the common memory or if data is being transferred from the first memory section to the second memory section at the time when the normal transfer of data from the second memory section to the first memory section would occur, the delay extending until data is transferred from the first memory section to the second memory section.

Also shown in an illustrated embodiment is arbitration circuitry for arbitrating data being written into a common memory from a first system and a second system which includes circuitry for writing data from the first system into a first section of the common memory upon receipt of a write command signal from the first system and circuitry for transferring data from the first memory section to the second memory section after data has been written into the first memory section. The arbitration circuitry also includes circuitry for writing data from the second system into the second memory location upon receipt of a write command signal from the second system if the first system has not written data into the common memory during the present memory access cycle of the second system. The arbitration circuitry also includes circuitry for transferring data from the second memory location to the first memory location after data has been written into the common memory by the second system.

Preferably the circuitry for transferring data from the second memory section to the first memory section includes circuitry for delaying the transfer of data from the second memory section to the first memory section if data is being written into the common memory by the first system or data is being transferred from the first memory section to the second memory section at the time when the normal transfer of data from the second memory section to the first memory section would occur, said delay extending until data is transferred from the first memory section to the second memory section.

As discussed above, the preferred embodiment of the common memory includes an array of dual cell memory modules. Each of the dual cell memory modules includes an upper cell, referred to as a timekeeping cell and a lower cell, referred to as a user cell. These two cells in each module are coupled together with circuitry to permit direct transfer of data from the timekeeping cell to the user cell and from the user cell to the timekeeping cell.

In the preferred embodiment, eight dual cell memory modules store eight bits or one byte of data representing the current time in seconds. Additional bytes of eight dual cell memory modules are also used to store minutes, hours, days of the week, days of the month, months, and years. The timekeeping cells have their own read and write circuitry and form the timekeeping section of the common memory. This section is connected to timekeeping circuitry which periodically performs memory access cycles by reading and writing data into the timekeeping section and transferring data from the timekeeping section into the user section. The user cells also have their own read and write circuitry and are connected to a computer bus in the preferred embodiment. The computer bus is part of the interface with a user which permits a user to read and write data from the user section of the common memory.

In operation the timekeeping circuit, once a second, performs a memory access cycle or update cycle by first reading the seconds byte of data, incrementing the seconds, and rewriting the seconds byte back into the timekeeper section of the common memory. If the seconds data changes from 59 to 00, then the timekeeping circuit also reads, increments, and rewrites the minutes byte of data. In a similar manner, each of the bytes are read and incremented as required. If a byte being read does not change to its beginning count, such as if the seconds after being incremented is not at 00, then the timekeeping circuit does not read any more of the higher bytes of data. At a predetermined time interval after the update begins, a command is issued to transfer all of the data in a timekeeping section into the user section of the common memory. The timekeeping circuit does not access the common memory between the update cycles.

Data is read from the user section of the common memory independently of the reading and writing operations in the timekeeping section. However, a collision can occur if data is written into the user section and then transferred to the timekeeping section at the same time the timekeeping section is performing an update procedure.

In order to ensure that the data written into the common memory by the user will not be overwritten by the timekeeping data, arbitration logic is provided to (a) transfer new user data from the user section to the timekeeping section of the common memory immediately after the user data is written into the user section of the memory; (b) inhibit further writes into the timekeeping section for the byte written into by the user and for all higher order bytes of stored data during the present update cycle; and (c) delay the normal transfer of data from the timekeeping section to the user section if a user write is occurring or a transfer is occurring between the user section to the timekeeping section, this delay lasting until the data is transferred from the user section into the timekeeping section.

Further, since the transfer of a bit of data from the user cell to the timekeeping cell depends on current supplied through the p-channel transistor of the six-transistor memory cell to charge an internal node of the timekeeping cell from ground to VCC, and since this p-channel transistor is relatively small, the transfer will not occur reliably if the enable transistors of the timekeeping cell receiving the transfer data are also conductive during a read operation since the capacitance of the memory bit line would be loading the p-channel transistor under these conditions. Therefore, the arbitration circuitry includes additional transistors to pull up the timekeeping bit lines if a transfer from the user cell to the timekeeping cell occurs at the same time a read operation of the timekeeping cell is occurring. While this pull up of the bit lines corrupts the data being read, the corrupted data is ignored since subsequent write operations into the timekeeping section are inhibited by the arbitration circuitry until the next update cycle.

Figure 7A:
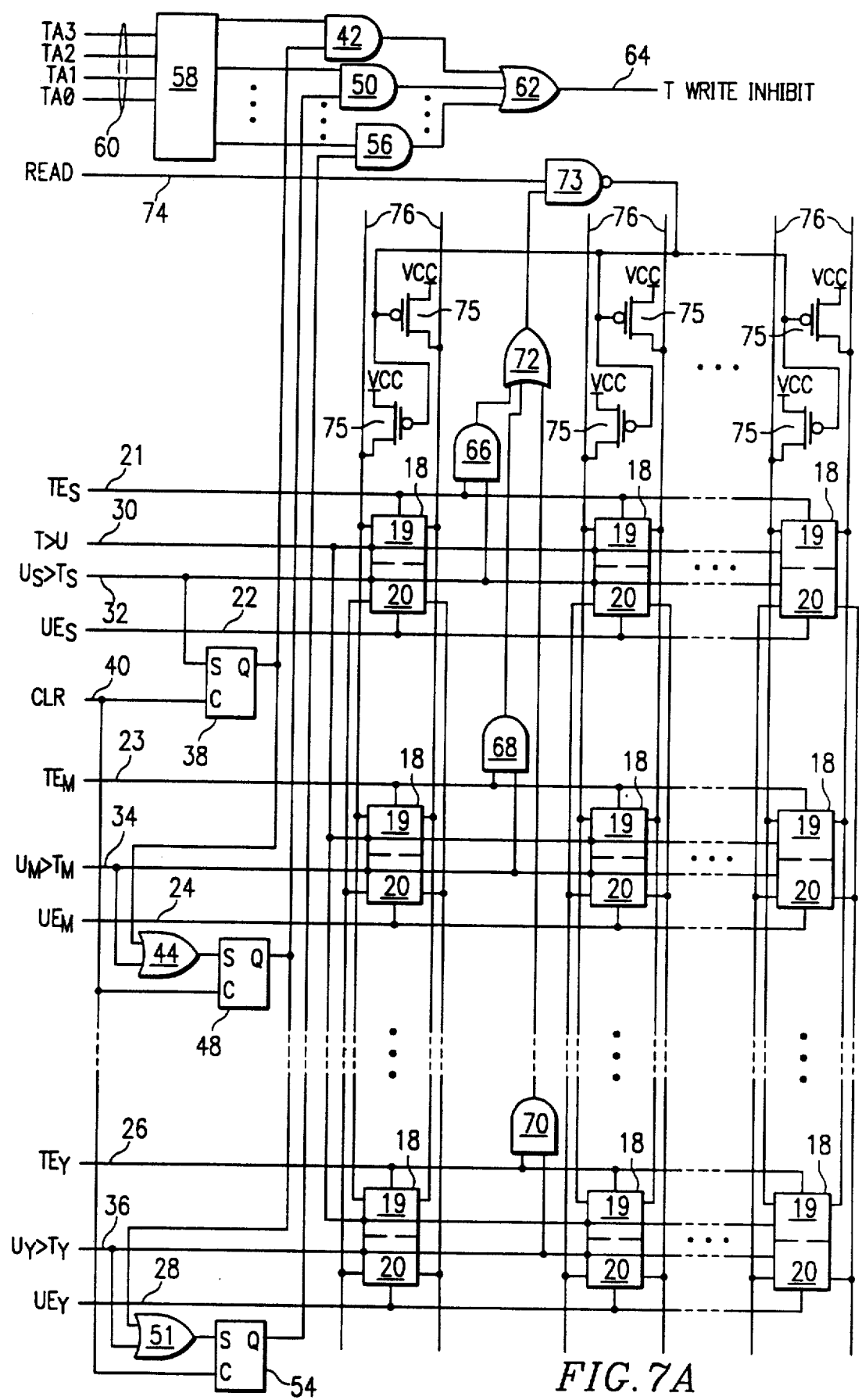
FIG. 7A is a logic diagram of a portion of the common memory of FIG. 1, including the arbitration circuitry preferably used.

Turning now to FIG. 7A, a portion of the arbitration circuitry preferably contained in the common memory 20 is shown. As shown in FIG. 7A, the timekeeping memory includes an array of dual storage cell memory modules or dual memories 18 arranged in rows and columns. These dual cell memory modules are described in the aforementioned co-pending application. The dual memory cells 18 include an upper or timekeeping cell 19 and a lower or user cell 720. The top row is used to store eight bits or one byte of seconds data, and the next row is used to store one byte of minutes data, and the last row is used to store one byte of year data. All of the timekeeping cells 19 of the dual memory cells 18 form the timekeeping section of the memory array and all of the user cells 720 form the user section of the memory array.

Each of the rows has a time enable line 721 connected to the enable transistors of the timekeeping cells 19 and a user enable line 722 is connected to the enable transistors in each of the user cells 720 of the first row of the memory array. Similarly, each of the other rows has time enable lines such as the time enable line 723 for the second or minutes row of the memory array and the user enable line 724 for the second row. The last row has a time enable line 726 and a user enable line 728.

A line 730 labeled T>U provides a signal to transfer data from the timekeeping cells 19 into the user cells 720 for all of the dual memory cells 18 in the memory array. A corresponding line 732 labeled US>TS provides a signal to the first row of the dual memory cells 18 to transfer data from the user cell 720 to the timekeeping cell 19. Similarly, a line 734 labeled UM>TM is used to transfer data from the user cell 720 to the timekeeping cell 19 in the second row of the memory array, and a signal line 736 labeled UY>TY transfers user data to the timekeeping cell 19 in the last row of the memory array.

The arbitration circuitry includes a latch associated with each row of the memory array. The first row has a latch 738 which has its set input connected to line 732 and its clear input connected to a CLR signal labeled on a line 740. The Q output of the latch 738 is connected to one input of an AND gate 742 and to one input of an OR gate 744. The output of the OR gate 744 is connected to the set input of another latch 748. The clear input of the latch 748 is connected to the line 740 and the Q output of the latch 748 is connected to one input of another AND gate 750 and also to one input of another OR gate associated with the latch for the third row and not shown in FIG. 7A. The last row of the memory array has an OR gate 751 one input of which is connected to a signal line 736 and the other input is connected to the Q output of the latch associated with the previous row of the memory array. The output of the OR gate 751 is connected to the set input of another latch 754, the clear input of which is connected to the CLR signal line 740. The Q output of the latch 754 is connected to the input of another AND gate 756. The second inputs of the AND gates 742, 750, and 756 are each outputs from an address decode circuit 758 which receives as inputs four address lines 760 consisting of the address signals TA0, TA1, TA2, and TA3. The output of the AND gates 742, 750, 756, and other similar AND gates which have inputs from the address decode circuit 758 and from the Q outputs of latches of the other rows not shown in FIG. 7A are all connected as inputs to an OR gate 762, the output of which forms the timekeeping write inhibit signal on a line 764.

Each of the rows of the memory cells has associated with it a two input AND gate including AND gates 766, 768, and 770 shown in FIG. 7A. Each of the two input AND gates 766, 768, 770, and the other AND gates associated with the other rows not shown in FIG. 7A has a first input connected to the enable lines for the timekeeping cells 19 such as lines 721, 723, and 726 and a second input connected to the lines which transfer data from the user cells 720 into the timekeeping cells 19 such as signal lines 732, 734, and 736. The output of the AND gates 766, 768, and 770, and the other similar AND gates not shown in FIG. 7A are all connected as inputs of an OR gate 772, the output of which is connected to one input on a NAND gate 773. The other input of the NAND gate 773 is connected to a TREAD signal line 774. The output of the NAND gate 773 is connected to the gates of a plurality of p-channel transistors 775, the sources of which are connected to VCC. The drains of each of the p-channel transistors 775 are connected to one of the bit lines 776 for each of the timekeeping cells 19. Thus when the output of the NAND gate 773 is a logic 0 level, the p-channel transistors 775 will operate to couple the bit lines of the timekeeping cells 19 to VCC.

FIG. 7B is a logic diagram of additional arbitration circuitry which is contained within the sequencer 14 shown in FIG. 1. The additional arbitration circuitry in FIG. 7B receives a signal labeled UWRITE on a line 780 which is connected to the input of an inverter 782, the output of which is connected to one input of an AND gate 784 and also connected to the input of a monostable multivibrator or one shot 786. The output of the one shot 786 is connected to a second input of the AND gate 784 and also to the input of an inverter 788, the output of which forms the U>T signal on a line 790. This U>T signal is then decoded in circuitry not shown in FIG. 7B in order to form the signals US>TS, UM>TM, etc. used in the common memory 20.

An XFER pulse on a line 792 is connected to the input of an inverter 794, the output of which is connected to one input of an NAND gate 796. The output of the inverter 794 is also connected to the input of another NAND gate 798. The output of the NAND gate 796 is connected to an input of another NAND gate 700 and also to a third input of the AND gate 784. Another signal, STSEQ, on a line 702 is connected to the input of an inverter 704, the output of which is connected to another input of the NAND gate 700 and also connected to the input of another NAND gate 706. The output of the NAND gate 700 is connected to another input of the NAND 796 and the NAND gates 796 and 700 operate as an RS latch. Similarly, the output of the NAND gate 798 is connected to another input of the NAND gate 706 and the output of the NAND gate 706 is connected to another input of a NAND gate 798 to form an RS latch. The output of the NAND gate 798 forms the CLR signal on line 740. The output of the AND gate 784 is connected to the input of another one shot 708. The output of the one shot 708 is connected to the input of another inverter 710, the output of which forms the T>U signal on line 730. The output of the inverter 710 is also connected to the input of another inverter 712, the output of which is connected to the input of another one shot 714, the output of which is connected to a third input of the NAND gate 700.

The operation of the arbitration logic will now be described with reference to FIG. 7C. When the oscillator 12 switches the clock line to the sequencer 14 to a pulse train rather than a logic 1 level, the oscillator 12 also provides an STSEQ pulse on line 702. The STSEQ pulse therefore occurs once a second. The oscillator 12 also provides the XFER pulse at a predetermined time after the STSEQ pulse. The XFER pulse is a signal to transfer data from the timekeeping cells 19 to the user cells 720 in the memory array. Thus when the STSEQ pulse arrives on line 702, the CLR signal on line 740 goes low as shown on the left hand side of FIG. 7C. Immediately after the CLR signal goes low, the sequencer 14 reads the seconds from the common memory 20 as shown by the RTS line in FIG. 7C. The seconds data is then updated and written back into the common memory 20 as shown by the WTS line in FIG. 7C. If the seconds read is not at 59, then the sequencer 14 does not read the minutes or other present time data in the memory array and thus the read minutes line shown as RTM and the write minutes line shown as WTM in FIG. 7C stay low during the time period shown on the left hand portion of FIG. 7C. The second update cycle is shown in the right hand portion of FIG. 7C in which the present seconds read from the common memory is at 59 and therefore a command to read the present minutes, the RTM command, is initiated; the minutes are updated; and then a write minutes command is also initiated.

Below the WTM line is the T>U signal on line 730. As shown in the left hand portion of FIG. 7C, this transfer normally occurs at the same time that the CLR signal goes back to a logic 1 level. Below the T>U signal in FIG. 7C is a WUM line which indicates that data is being written from the user into the minute user cells 720 of the memory array. Below the WUM line is the UM>TM line which shows that the user data is transferred from the user cells 720 into the timekeeping cells 19 immediately after data is written by the user into the user cells 720 of the memory array.

As shown in FIG. 7C, when the user writes seconds or any data into the memory array during the time that the CLR signal is at a logic 1 level, then there is no conflict between the timekeeping circuit 10 and the user. During this user write, the CLR line 740 is a logic 1 level which holds the Q outputs of the latches 738, 748, and 754 at a logic 0 level and therefore the timekeeping write inhibit line 764 remains at a logic 0 level. Also since none of the time enable lines such as lines 721, 723, and 726 is at a logic 1 level during this time, the output of the NAND gate 773 remains at a logic 1 level and thus the p-channel transistors 775 remain nonconductive.

The circuitry shown in FIG. 7B operates in the following manner for the operation shown in the left hand portion of FIG. 7C: upon receipt of the STSEQ pulse on line 702, the output of the NAND gate 796 becomes a logic 0 level while the output of the inverter 782 and the one shot 786 is at a logic 1 level and therefore the output of the AND gate 784 is at a logic 0 level which inhibits the operation of the one shot 708. Upon receipt of the XFER pulse on line 792, the output of the NAND gate 796 switches to a logic 1 level, which causes the output of the AND gate 784 to change to a logic 1 level which fires the one shot 708 to generate the T>U signal on line 730. The one shot circuits 786, 708, and 714 are triggered by a rising edge at their inputs. The falling or trailing edge of the T>U signal on line 730 is inverted to trigger the one shot 714 at the end of the T>U pulse and the output of which is fed back as a third input to the NAND gate 700 to reset the output of the NAND 796 to a logic 0 level. Thus, the arrival of the XFER signal on line 792 initiates the T>U signal on line 730 and also forces the CLR line 740 to a logic 1 level.

Later, when the user writes into the seconds row of the memory array, the UWRITE signal on line 780 goes to a logic 1 level and then to a logic 0 level, and this falling edge is inverted and fires the one shot 786 to form the U>T signal on line 790. While the UWRITE signal on line 780 and U>T signal on line 790 is at a logic 1 level, then the output of the AND gate 784 is held at a logic 0 level; however, for the timing shown in the left hand portion of FIG. 7C, the output of the NAND gate 796 is also at a logic 0 level during the time that the UWRITE signal on line 780 and the U>T signal on line 790 is at a logic 1 level.

Turning now to the timing shown on the right hand side of FIG. 7C, the WUM signal goes high during the time that the RTM signal is high, indicating that data is being written into the minutes byte in the user cell 720 during the same time that data is being read from the minutes cells 19 by the sequencer 14. Immediately following the user write into the minutes byte, the UM>TM on line 734 goes to a logic 1 level. The AND gate 768 then detects a logic 1 level on the TEM line 723 and the UM>TM signal on line 734 and the output of the AND gate 768 becomes a logic 1 level which causes the output of the OR gate 772 to become a logic 1 level which causes the output of the NAND gate 773 to be a logic 0 level which enables or makes conductive the p-channel transistors 775 which pulls the bit lines associated with the timekeeping cells 19 to a logic 1 level to enable the user timekeeping data to be reliably transferred into the timekeeping cells 19 in the second row of the memory array.

Also, the logic 1 level on the UM>TM line 734 forces the output of the OR gate 744 to a logic 1 level which forces the Q output of the latch 748 to a logic 1 level. This Q output of the latch 748 is used by the AND gate 750 and the OR gate 762 to inhibit further writes into the second row of the memory array. The logic 1 level at the Q output of the latch 748 also sets the Q output of the next row latch to a logic 1 level and each of the succeeding rows, down through the last row, to a logic 1 level. Thus the Q output of the latch 754 will also be a logic 1 level, and will bus through AND gate 756 and OR gate 762 to inhibit writes into any of the rows of the logic array except the first row. Thus, the read operation by the sequencer which has been disturbed by the operation of the p-channel transistor 775 will have no effect on the data stored in the common memory, since all of the succeeding writes into the common memory will be inhibited by the TWRITE inhibit line 764. The Q outputs of the latches 738, 748, and 754 will go to a logic 0 level upon the next logic 1 level at the CLR line 740.

FIG. 7C also shows the case where a second user write operation occurs when the normal update or transfer of data from the timekeeping cells 19 into the user cells 720 would normally occur (as shown by the phantom pulse on the right hand side of FIG. 7C). As shown in FIG. 7B, when the UWRITE line 780 or the U>T line 790 is a logic 1 level, then the output of the AND gate 784 will be inhibited. When the XFER signal on line 792 goes to a logic 1 level, which forces the output of the NAND gate 796 to a logic 1 level (which would normally begin the data transfer from the timekeeping section to the user section), this transfer is delayed until the time that both the UWRITE signal on line 780 and the U>T signal on line 790 go to a logic 0 level. At that point the output of the AND gate 784 goes to a logic 1 level, to fire the one shot 708 and form the T>U pulse on line 730.

As can be seen from the foregoing discussion, the user data is always written into the memory when it is available and the arbitration logic protects the user data from being corrupted by the timekeeping data during the present update cycle of the timekeeping circuit 10. Thus, the preferred arbitration circuitry operates to resolve conflicts between the timekeeping circuit 10 and the user data on the computer bus 24 with respect to writing data into the common memory 20.

PREFERRED PLA 70

Figure 4A:
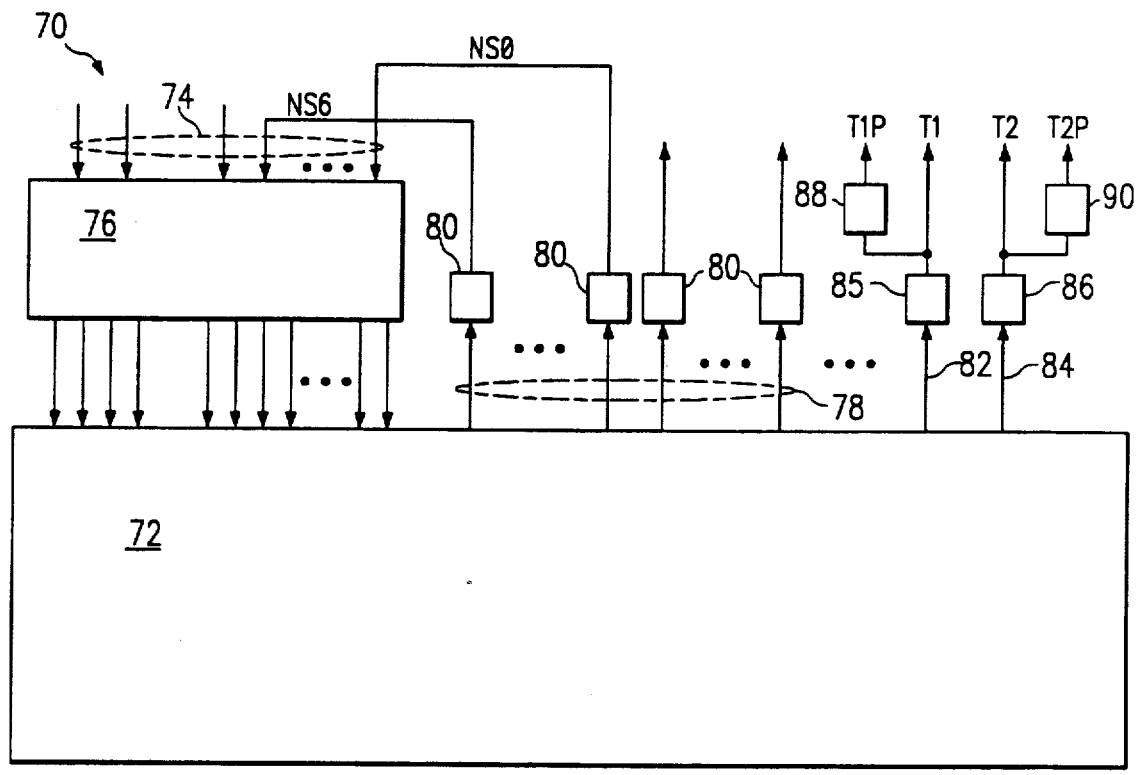
FIG. 4A is a block diagram of the PLA portion of the sequencer of FIG. 1.

FIG. 4A shows a block diagram of the PLA 70, including a PLA array 72 as shown. The PLA 70 and the PLA array 72 will now be described in detail. The PLA circuit receives a plurality of address lines 74 which are connected as inputs into an address decoder circuit 76.

The address decoder circuit 76 provides true and complementary address lines into the PLA array 72 for each of the address lines 74. The PLA circuit 70 also includes a plurality of data lines 78 which are connected to precharge and latch circuits 80, as described below.

Two additional data lines 82 and 84 are connected as inputs to dynamic buffer circuits 85 and 86. (The most preferred embodiment of these buffers is described below.) The outputs of the buffer circuits 85 and 86 form timing signals T1 and T2 respectively which are also connected as inputs to two one-shot circuits 88 and 90, the outputs of which form signals T1P and T2P respectively.

CONNECTION OF DATA LINES, STATE LINES, AND ADDRESS LINES

Seven of the data lines 78 form signals NS0-NS6 which are the next state data lines which are used as inputs into the address decoder circuit 76. The outputs of the address decoder circuit 76 corresponding to the next state input lines forms the present state address lines into the PLA array 72.

The address lines 74 consist of 23 addresses, 7 of which are the next state data lines out of the PLA array, and 8 of which come from the A data bus 26. The remaining consist of a FEB address line which is high (logic 1 level) when the present month is February; an LEAP address line which is high when the present year is a leap year; a THRT address line which is high when the present month has 30 days; an HRM address line which is high when the stored data is for a 24 hour clock and low (logic 0 level) when the data is for a 12 hour a.m., p.m. clock; a DM address line which is high when the data is stored in binary format and low when the data is stored in BCD format; an S line which is high on the first Sunday of April, the day when the switch is made from standard time to daylight savings time; an F address line which is switched high at the start of the last Sunday in October when the switch is made from daylight savings time to standard time; and an EQLZ address line which is one when the accumulator compares the data on the A bus 26 and the B bus 28 and finds the two buses have the same data. The FEB, LEAP, THRT, S, and F address lines are formed by combinatorial logic in the sequencer 14 from data taken from the signal lines 72 and 74 of the timekeeping cells 68 storing the present day of the week, date of the month, month, and year data.

There are 29 data lines 78 out of the PLA array 72 not including the two timing lines 82 and 84. The 29 data lines include eight data lines providing data to the B data bus 28 and the seven data lines for the next state into the address lines 74 of the PLA 70. The other data lines are as follows: a UDC data line which when ANDed together with the T2P timing signal forms a signal back to the oscillator to tell the oscillator to hold the clock signal on lines 13 from the oscillator to the sequencer at a logic 1 level until time for the next update cycle; an ALMF data line which provides a signal to an interrupt mask circuit in the common memory 20 which, if enabled by the user, will cause an interrupt to be presented on the computer bus 24 and is used to signal that an alarm match has been found; four data lines TAD0-TAD3 which are address lines into the common memory 20; an ALPHA data line which is used to reset a latch circuit when the timekeeper switches from daylight savings time to standard time at 1:00 a.m. on the last Sunday in October. This ALPHA signal changes the state of the F address line so that the sequencer won't set its time back one hour more than once each year. An RWB data line to signal the memory whether to read or write data; an RAMEN data line which, when at a logic 1, enables the common memory 20 to read or write data and when at a logic 0 causes the common memory 20 to precharge the timekeeping bit lines in the memory; an ALMM line to signal that the sequencer is in an alarm sequence rather than a time update sequence; three signal lines S0–S2 to the accumulator 18 to control whether the accumulator is to transfer data from the B bus onto the A bus, to increment the data on the A bus or to add the A bus to the B bus and place the resultant on the A bus; and a CI data line as a carry input into the accumulator 18.

PLA: GENERAL CONSIDERATIONS

Dynamic PLA read-only memories include a matrix of PLA lines and address/data lines. For example, the PLA lines may be laid out in rows with the address and data lines forming columns of the matrix. The PLA operates by precharging the PLA lines and the data lines in a precharge operation which is then followed by an evaluate operation in which the PLA lines enabled by the present address provide a logic 1 level in the data section of the memory which operates to discharge the data lines coupled to the enabled PLA lines by n-channel pull down transistors. Thus, the selected data lines, which were precharged to a logic 1 level, are pulled to ground potential by the selected PLA lines. After the data lines have stabilized, the logic level on the data lines is captured in a latch.

A critical timing operation is the latching of the state of the data lines. The state of the data lines does not change immediately when the evaluation operation begins, due to the capacitance on the PLA lines and the data lines. Also, due to the leakage, the non-selected data lines which will eventually lose their charge and become a logic 0 level even though not selected in the current read operation. Therefore, the logic state of the data lines must be captured in a latch within an appropriate time window after the evaluate operation begins.

This delay time, between the start of the evaluation cycle and the time window when the correct data is on the data lines, is a function of the manufacturing process and therefore varies from manufacturing lot to manufacturing lot. Also, in certain systems, an appropriate external clock pulse, which is normally used to provide this timed delay, is not readily available.

Advantageously, the preferred dynamic PLA timing circuit compensates for variations in the manufacturing process and which does not require an external clock signal.

Shown in an illustrated embodiment is a timing apparatus for use with a memory device which includes PLA line having a series combination of a precharge transistor, an address section, and a data section, the data section being connected to the control terminal of a switching device coupled to a data line, the data line forming the output of the timing apparatus. The timing apparatus also includes at least one additional address section of a PLA line and also includes shorting strips connected from various portions of the address section of the PLA line to the corresponding places on the at least one additional address section such that the PLA line is conductive from the precharging transistor to the data line for any address into the memory device.

SPECIFIC PLA STRUCTURE USED IN THE PREFERRED EMBODIMENT

The dynamic PLA timing circuit in the preferred embodiment is used in a dynamic PLA ROM. The timing circuit consists of one PLA line connected in parallel with the address section of the second PLA line. In the full PLA line one of each pair of true and complementary address lines makes contact in the address portion of the PLA line, and the other of each pair of true and complementary address lines makes contact to the address section of the second PLA line. In the data section of the PLA line contact is made with the gates of all of the data transistors associated with each of the data lines, but significantly the drain of all of these transistors, except one, is disconnected from its associated data line. The data line making contact with the drain of the transistor gated by the PLA line forms the output signal of the timing circuit. The address portion of the first PLA line and the address portion of the second PLA line are shorted together on either side of each pair of true and complementary address lines. Thus, for any address combination into the ROM, a conductive path is formed through the address portion of the combination of the first PLA line and the second truncated PLA line.

A read operation begins with a precharge cycle in which a p-channel transistor coupled between the address section of the PLA lines and VCC is turned off or made nonconductive while an n-channel transistor connected to the data portion of the PLA lines is made conductive thereby causing the PLA lines to be at ground potential. When the PLA ROM switches from the precharge mode to the evaluation mode, the n-channel transistor is first turned off and then the p-channel transistor is then turned on or made conductive which allows the addressed PLA line to begin charging toward VCC. The PLA lines have distributed capacitance associated with them and each gate connection of the PLA lines adds additional distributed capacitance to the lines which in turn slows down the charging of the PLA lines toward VCC. Since the timing PLA line in combination with the truncated PLA line have gate connections to all of the address lines and since the timing PLA line also has gate connections to each of the data line transistors, the PLA timing line has a capacitance greater than any of the other PLA lines in the array. The voltage potential on the timing PLA line or data line will always lag the rising voltage on the other PLA lines and thus when the data line controlled by the timing PLA line switches from a logic 1 to a logic 0 condition, all of the other data lines will have stabilized by that time. Thus the output of this timing circuit is used to latch the data from the other data lines into their respective latch circuits.

Also in the preferred embodiment of the invention, the output of a first timing PLA line is used to control the p-channel precharge transistor of a second timing PLA circuit to form a second time delay pulse which is delayed from the output of the first timing circuit by the same time delay as the first timing circuit.

Figure 4D:
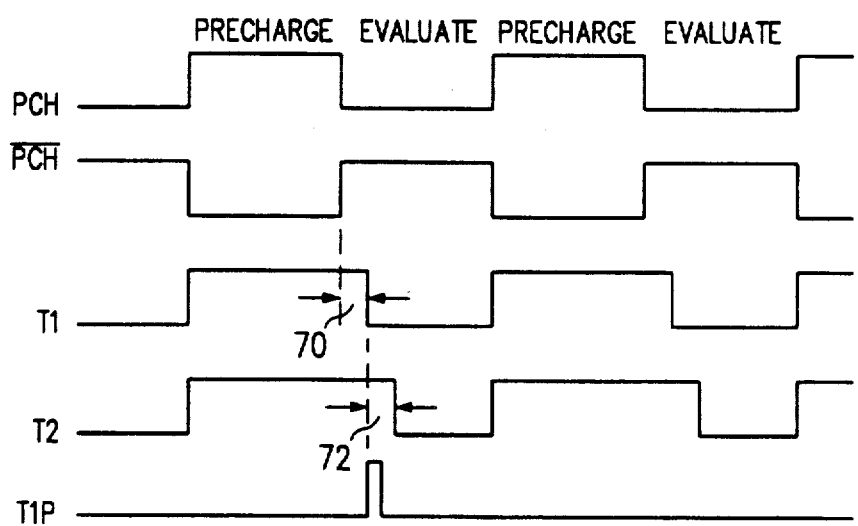
FIG. 4D is a timing diagram showing the timing relationship of various signals in FIG. 4B and FIG. 4C.
Figure 4B:
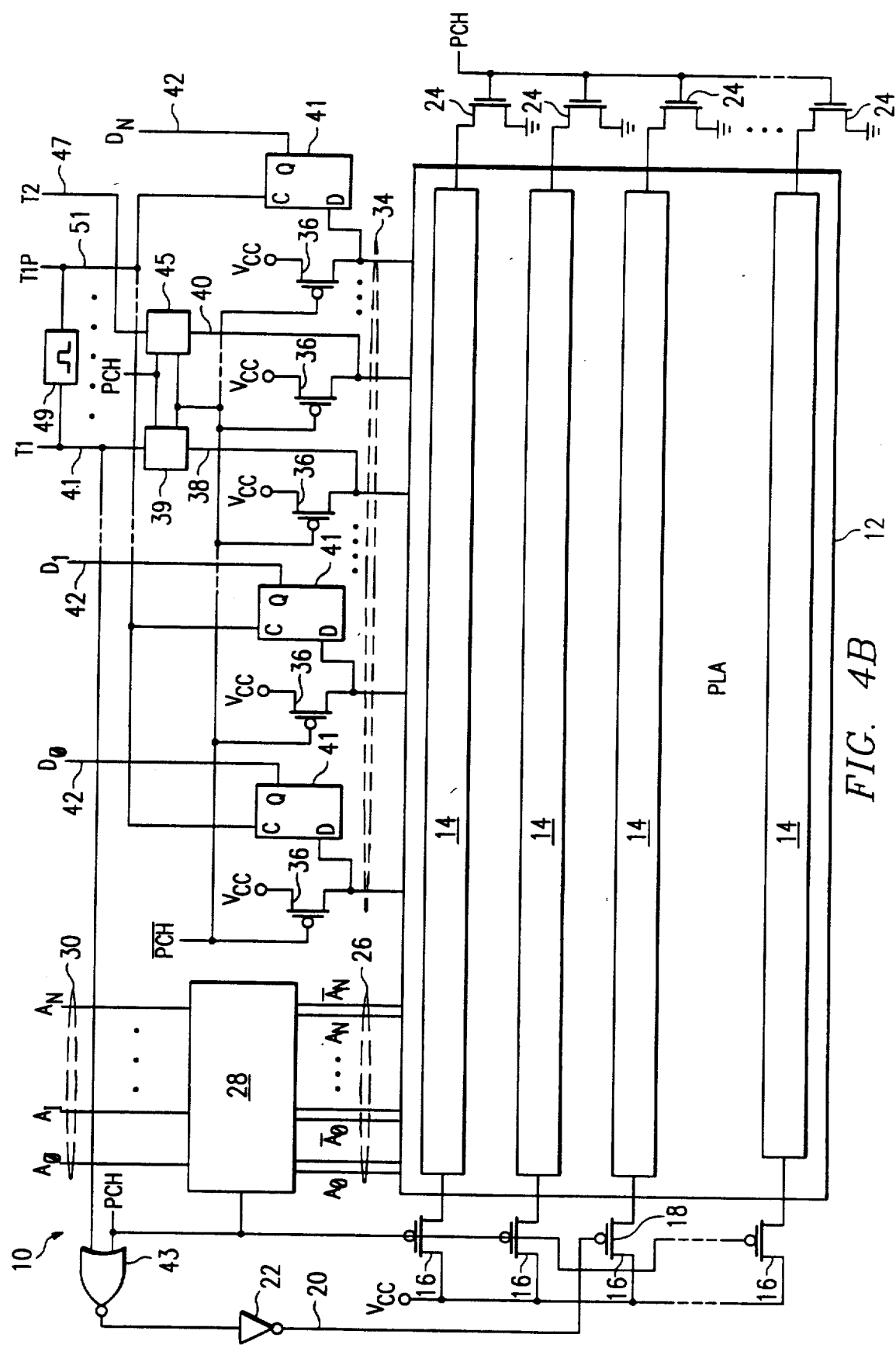
FIG. 4B shows a block diagram of a dynamic PLA ROM, showing the timing circuit used in the preferred embodiment.

Turning now to the drawings, FIG. 4B shows a dynamic PLA ROM 410 which includes timing circuitry according to the present invention. The PLA ROM 410 includes a PLA array 412 which, in the preferred embodiment, has PLA lines 414 arranged as rows in the PLA array 412. Each of the PLA lines 414 is coupled to VCC through the drain and source terminals of a p- channel precharge transistor 416. Each of the p-channel precharge transistors 416 except one, shown as 418 in FIG. 4B, has its gate connected to a precharge signal PCH. The precharge transistor 418 has its gate connected to a signal line 420 which is connected to the output of an inverter 422. The other end of each of the PLA lines 414 is connected to the drain of an n-channel precharge transistor 424. The sources of the n-channel precharge transistors 424 are connected to ground and the gates are connected to the precharge signal PCH.

The columns of the PLA array 412 are divided into two sections, the first being an address section having address column lines 426 which are driven by an address decoder circuit 428. The address decoder circuit 428 receives address inputs on the address lines 430 and provides true and complementary address lines 426 for each of the input address lines 430. The address decode circuit 428 also receives the PCH precharge signal. The second section of the columns of the PLA array 412 are the data output lines 434, each of which is connected through a p-channel precharge transistor 436 to VCC. The gates of the p-channel precharge transistors 436 are connected to a precharge signal PCH*. All of the data lines 434, except for the two data lines 438 and 440, are connected to the D input of a latch circuit 441. The Q outputs of the latches 441 form the data output lines 442 of the dynamic PLA ROM 410. The signals PCH and PCH* are generated by circuitry not shown in the drawings but well known to those skilled in the art.

The data line 438 is connected to the input of a dynamic buffer circuit 439. (The dynamic buffer circuit 439 in the preferred embodiment is described below with reference to FIGS. 8A-8D.) The output of the dynamic buffer circuit 439 forms the T1 signal on line 441. Line 441 is connected to one input of a NOR gate 443, the output of which is connected to the input of the inverter 422. A second input of the NOR gate 443 is connected to PCH.

The T1 line 441 is also connected to the input of a one shot 449. The one shot 449 in the preferred embodiment is described in U.S. patent application Ser. No. 208,288, Filed 6/17/88, entitled DELAY CIRCUIT PROVIDING SEPARATE POSITIVE AND NEGATIVE GOING EDGE DELAYS, which is incorporated herein by reference. The one shot 449 is triggered by a falling edge on its input, and provides a positive pulse at its output. The output of the one shot 449 forms the T1 pulse on a line 451 which is connected to the clock inputs of each of the latch circuits 441.

The data line 440 is connected to another dynamic buffer circuit 445, the output of which forms the T2 signal on line 447.

FIG. 4C is a schematic diagram of a portion of the PLA array 412. The top PLA line 414 in FIG. 4C is a standard PLA ROM line which has an address section 446 and a data section 448. The ROM PLA line 414 address section 446 is comprised of a series connection of p-channel transistors 450 which are connected to selected address lines 426. The data section 448 of the ROM PLA line 414 is connected to the control terminals or gates of selected data transistors 452 which have their drains connected to their associated data lines 434 and their sources connected to ground.

Also shown in FIG. 4C are two timing circuits. The first timing circuit includes a PLA line 454 which has connections to each of the true address lines in the address section 446 and which has connections to the gates of each of the data line transistors 456. All except one of the data line transistors 456 does not have a connection between its drain and its associated data line 434. The one exception is the data line transistor 458 which has its drain connected to the data line 438 which is coupled through the dynamic buffer circuit 439 to form the T1 timing signal. Connected in parallel with the PLA line 454 is a truncated second PLA line 460. The truncated PLA line 460 includes only the address portion 446 of the PLA line and makes connection to each of the complementary address lines 426. The address portion of the PLA line 454 and the truncated PLA line 460 are shorted together on either side of each pair of true and complementary address lines.

Similarly, a second timing circuit is composed of another PLA line 462 and a second truncated PLA line 464. The data section 448 of the truncated PLA line 462 is also connected to each gate of its associated data transistors 466, all of which except one have no connection between their drain and their associated data line 434. The one data line transistor 468 which is connected to the data line 440 which, in turn, is coupled through the dynamic buffer circuit 445 to form the T2 timing signal. The address sections of the PLA line 462 and the truncated PLA line 464 are connected the same as the address sections of the PLA line 454 and its associated truncated PLA line 460.

In operation, and with reference now to FIG. 4D, the PLA ROM of the preferred embodiment begins with a precharge cycle in which the p-channel precharge transistor 416 are made nonconductive and the n-channel precharge transistors 424 are made conductive thereby pulling the data section 448 of the PLA lines to ground potential. At the same time the address decode circuit 428 captures the data on the address line 430 and provides the true and complementary address pairs 426 into the address section 446 of the PLA array 412. Also at this time the p-channel precharge transistors 436 connected to each of the data lines 434 are enabled to precharge each of the data lines 434 to VCC.

When the precharge signals PCH and PCH* switch to the evaluate cycle of the ROM operation as shown in FIG. 4D, then the p-channel precharge transistors 416 are enabled and the n-channel precharge transistors 424 are disabled. At the same time the p-channel precharge transistors 436 connected to the data lines are disabled thereby isolating the VCC charge on the data lines 434. In the standard PLA ROM line 414 if the address lines 426 connected to the series address transistors 450 are all at a logic 0 level, then the VCC voltage will propagate down the address section of the PLA line 414 and cause the PLA line 414 in the data section 448 to go to VCC. The VCC voltage will enable each of the data transistors 452 connected to the PLA line 414 which will thereby discharge their associated data lines 434. If one of the address lines connected to the series p-channel transistors 450 in the address section 446 of the PLA ROM array 414 is not at a logic 0 level, then the VCC voltage will be blocked from the data section 448 of the PLA line 414 and the associated data transistors 452 will remain nonconductive and will not pull down their associated data lines 434.

The first timing circuit consisting of the PLA line 454 and the truncated PLA line 460 in conjunction with their shorting connections between each pair of true and complementary bit lines forms a continuous conductive path between the precharge transistor 416 and the data section 448 of the PLA lines 454. Thus, when the PLA ROM enters its evaluate cycle, the VCC voltage will be applied to the data section 448 for any address into the ROM on the address lines 430. However, the data section 448 of the PLA line 454 will not rise instantaneously but will rise at a rate determined by the capacitance on the PLA line 454 and the truncated PLA line 460. The magnitude of this capacitance is subject to process variations. Since the PLA line 454 and truncated PLA line 460 make contact to every address line 426 and has a contact to the gate of every data transistor 456 and therefore has more capacitance than the PLA ROM lines irrespective of process variations, the voltage rising on the PLA line 454 will rise more slowly than the voltage on any of the PLA ROM lines and thus the data transistor 456 will be enabled later than any other data transistor 452 associated with the PLA ROM lines. Thus, the voltage on the data line 438 will switch from a logic 1 to a logic 0 level at a time when each of the other data lines 434 has stabilized at its voltage and before a time that the data lines 434 which have not been pulled down by a data line transistor will have leaked their charge and assumed a logic 0 voltage level. The falling edge of the signal on the data line 438 is coupled through the dynamic buffer circuit 439 to fire the one shot 449, the output of which latches the data from the other data lines into their respective latch circuits 441.

The signal on the data line 438 is NOR'd with the PCH signal and inverted by the inverter 422 to form the precharge signal at the gate of the p-channel precharge transistor 418 for the T2 data line. Thus, the p-channel precharge transistor 418 is held nonconductive until the T1 data signal falls to a logic 0 level which begins the timing circuit on the PLA line 462. The output of the second timing circuit is on the data line 440. This second timing signal T2 on line 447 is used for timing in other ratioless circuitry on the integrated circuit chip embodying the preferred embodiment of the present invention.

As shown in FIG. 4D, the T1 delay time is shown as element 470 and the T2 time delay is shown as element 472.

Thus, this dynamic PLA timing circuit advantageously compensates for the manufacturing variations in the PLA ROM circuit, and is able to provide a timing circuit independent of an external clock to the PLA ROM.

LOW-POWER BUFFER CIRCUITS

The preferred embodiment of the low-power buffer circuits will now be described in detail. The preferred embodiment uses an innovative gating circuit for increasing the slew rate of low slew rate input signal and minimizing power drain during the switching operation. The gate includes a first stage of amplification which has an input node and an output node. The output node is operable to be precharged to a low voltage during the precharge cycle when the input node is pulled to a logic high. During switching, the output node is pulled to a high reference voltage. A switch is disposed between the pull-up circuit and the output node and is operable to isolate the pull-up circuit from the output node during the precharge cycle. The switching element becomes conductive when the input voltage falls below a predetermined threshold and has a transconductance with a square law current relationship.

Within this circuit, the pull-up circuit is preferably realized with a P-channel transistor and the precharge circuit is realized with an N-channel transistor. The N-channel transistor has the source-to-drain path thereof connected between the output node and ground and the gate thereof connected to a precharge clock. The P-channel transistor has the source-to-drain path thereof connected between an intermediate node and a power supply and the gate thereof connected to the precharge clock. The transconductance element comprises a switching P-channel transistor having the gate thereof connected to the input node and the source-to-drain path thereof connected between the intermediate node and the output node. The precharge signal is a high slew rate signal whereas the input node is a low slew rate signal. Therefore, the P-channel pull-up transistor is turned off when the N-channel precharge transistor is turned on. The switching P-channel transistor isolates the output node from the intermediate node during precharge such that current is not drawn.

Preferably an additional stage of gain is also provided, with an N-channel transistor that has the gate thereof connected to the output node of the first stage and the source thereof connected to ground. The drain of the N-channel transistor is precharged to a high logic state during the precharge cycle and then allowed to float during the switching cycle. When the gate of the N-channel transistor goes high, the drain thereof is pulled low to provide additional amplification.

Figure 8A:
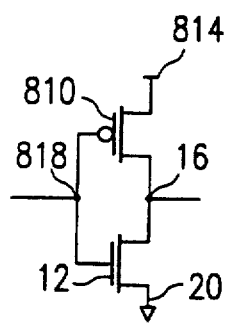
FIG. 8A illustrates a schematic diagram of a prior art CMOS inverter.

Referring now to FIG. 8A, there is illustrated a schematic diagram of a prior art CMOS inverter. The CMOS inverter is comprised of a P-channel transistor 810 and an N-channel transistor 812. The P-channel transistor 810 has the source thereof connected to a supply terminal 814 and the drain thereof connected to an output node 816. Node 816 has a capacitance associated therewith that is a combination of the drain capacitance of transistors 810 and 812 and a capacitive load (not shown). The gate of P-channel transistor 810 is connected to an input node 818. The N-channel transistor 812 has the source thereof connected to a ground terminal 820, the drain thereof connected to the output node 816 and the gate thereof connected to the input node 818.

In the operation of the prior art device of FIG. 8A, a low logic state on the input node 818 results in the P-channel transistor 810 being turned on and the N-channel transistor 812 being turned off. As such, the P-channel transistor provides a resistance path to charge up the capacitance on node 816. When the input signal on input node 818 is a logic high, the P-channel transistor 810 is turned off and N-channel transistor 812 is turned on, pulling node 816 to the ground terminal 820 and discharging the capacitance on node 816.

Each of the transistors 810 and 812 provide a series resistance between the power supply terminal 814 and the output node 816 or the ground terminal 820 and output node 816. Since the inputs to the various CMOS gates in a CMOS circuit are relatively high impedance, the only current drawn is the current necessary to charge the capacitance on the output node 816. However, during switching, from, for example, a low logic state, one transistor must be turned on and the other transistor turned off in order to prevent a static current from flowing between the power supply terminal 814 and ground terminal 820. When the voltage on the input terminal 818 is low, P-channel transistor 810 is turned on and N-channel transistor 812 is turned off. When the voltage goes from a low voltage to a high voltage, N-channel transistor 812 is turned on when the voltage exceeds the $V_T$ of transistor 812. However, P-channel transistor 810 and N-channel transistor 812 are both turned on until the input voltage is greater than one $V_T$ below the power supply voltage on power supply terminal 814. Current path is provided from the power supply terminal 814 to the ground terminal 820 resulting in undesired current drain. For a very fast slew rate input voltage, this current drain is minimal as compared to the overall operating current in the system. However, this current significantly increases as the input slew rate decreases.

Figure 8D:
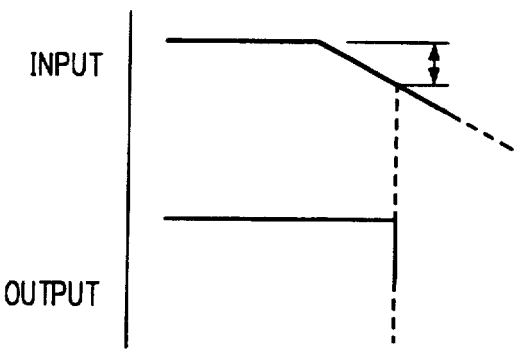
FIGS. 8C and 8D illustrate timing diagrams explaining the operation of the buffer of the preferred embodiment.
Figure 8B:
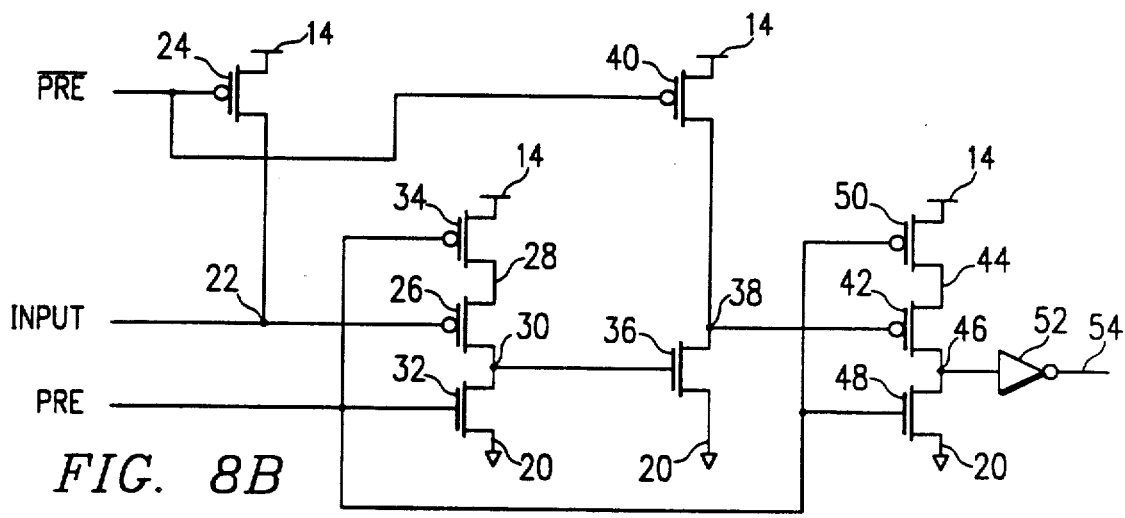
FIG. 8B illustrates a schematic diagram of the CMOS buffer of the preferred embodiment.

Referring now to FIG. 8B, there is illustrated a schematic diagram of the dynamic gate of the presently preferred embodiment. The input signal is received on an input node 822 and is operable to make the transition from a high logic state to a low logic state. It is this transition that is sensed by the circuit of FIG. 8B and translated to the output of the circuit on an output node wherein minimal current is drawn from the power supply node 814 to the ground node 820 irrespective of the slew rate of the input signal. Additionally, the slew rate of the output signal is significantly increased such that it is compatible with remaining gates in the system.

The input node is initially precharged through a P-channel transistor 824 which has the source thereof connected to a power supply terminal 814, the drain thereof connected to the node 822 and the gate thereof connected to a precharge-bar signal PRE-bar. The input node 822 is also connected to the gate of the P-channel transistor 826. P-channel transistor 826 has the source thereof connected to a node 828 and drain thereof connected to a node 830 to provide a source-to-drain path therebetween when the voltage on the input node 822 is one $V_T$ below the voltage on node 828. An N-channel transistor 832 is provided having the source thereof connected to the ground terminal 820, the drain thereof connected to the node 820 and the gate thereof connected to a precharge signal PRE. A P-channel transistor 834 is provided having the source thereof connected to the power supply terminal 814, the drain thereof connected to node 828 and the gate thereof connected to the PRE signal.

Figure 8C:
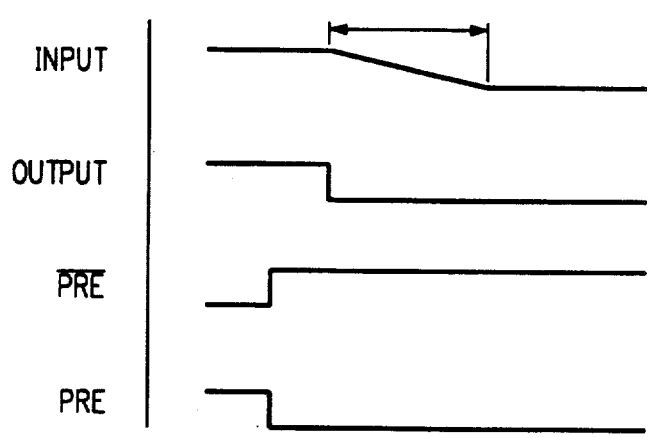

The node 830 is connected to the gate of an N-channel transistor 836, the source of which is connected to ground terminal 820 and the drain of which is connected to a node 838. A P-channel transistor 840 is provided having the source thereof connected to the power supply terminal 814, the drain thereof connected to node 838 and the gate thereof connected to the PRE-bar signal. The node 838 is connected to the gate of a P-channel transistor 842 which has the source thereof connected to a node 844 and the drain thereof connected to a node 846. An N-channel transistor 848 is provided having the source thereof connected to the ground terminal 820, the drain thereof connected to the node 846 and the gate thereof connected to the PRE signal. A P-channel transistor 850 is provided having the source thereof connected to the power supply terminal 814, the drain thereof connected to the node 844 and the gate thereof connected to the PRE signal. The transistors 842, 848 and 850 are configured similar to the transistors 826, 832 and 834. The node 846 is connected to the input of a standard CMOS inverter 852, the output of which is connected to the output node 854 of the circuit in FIG. 8B. With reference to FIGS. 8C and 8D, the operation of the circuit in FIG. 8B will be described. Initially, the PRE signal is high and the PRE-bar signal is low. When PRE-bar is low, P-channel transistor 824 is turned on, pulling input node 822 to a high logic level, thus precharging the input node 822. Although not described herein, node 822 is connected to a long conductive run in an address decode circuit with the P-channel transistor 824 providing the precharge operation of that line. This node therefore has a high capacitance associated therewith. However, the precharge transistor 824 can have the function thereof provided by other peripheral circuitry associated with the input driving circuitry. The input node 822, due to its large associated capacitance, will have a low slew rate during precharge to a high logic state and switching to a low logic state.

The PRE signal is high during precharge to turn off transistor 834 and turn on transistor 832. This results in node 830 being pulled low to turn off transistor 836. It should be noted that the precharge clock is a very high slew rate clock such that current drain from the power supply terminal 814 and the ground terminal 820 during switching in the precharge cycle is minimized. Transistor 834 prevents current flowing from the power supply node 814 through transistor 826 when PRE goes high and PRE-bar goes low turning on transistor 824. Since node 822 has a low slew rate associated therewith, transistor 826 conducts for a short time during switching, which, without transistor 834, would result in current drain. The P-channel transistor 840 is turned on when the PRE-bar signal goes low, pulling node 838 high, since transistor 836 is turned off. Node 838 turns off transistor 842 and the PRE signal turns off transistor 850 and turns on transistor 848. Transistor 848, during the precharge cycle, pulls node 846 low. Therefore, during precharge, node 830 is pulled low, node 846 is pulled low, and node 838 is pulled high. When node 846 is pulled low, output node 854 is pulled high. The precharge operation is operable to switch the output from a logic low to a logic high. After precharge, the PRE signal goes low and the PRE-bar signal goes high. This results in node 828 being pulled high and node 844 being pulled high.

Once the circuit of FIG. 8B has been precharged, the circuit remains in a static state with nodes 828 and 844 pulled high and nodes 830, 838 and 846 floating, since N-channel transistors 832, 836 and 848 are turned off and P-channel transistors 826, 840 and 842 are turned off. When the input node 822 begins to go low as a result of a transition from a logic high to a logic low, transistor 826 begins to conduct when node 822 falls one $V_T$ below the power supply voltage. This is illustrated in FIG. 8D. The transistor 826 begins to conduct once its threshold voltage has been exceeded to pull node 830 up to the potential of node 828. Since the only loading on node 830 is the capacitive loading of the gate of transistor 836, this happens very quickly. It should be noted that transistor 832 is turned off and therefore, current does not flow from node 828 to the ground terminal.

Once the $V_T$ of transistor 836 is exceeded, node 838 is pulled low, turning on transistor 842 and pulling node 846 high. This results in the output of inverter 852 going low. The N-channel transistor 836 provides a stage of gain to the node 830 that allows node 830 to be pulled high when the threshold of the transistor 826 is exceeded. It is important that node 838 be pulled low at a much faster rate than the slew rate of the input node 822. The output stage consisting of transistors 842, 848 and 850 further amplifies this speed when the voltage on node 838 falls below the voltage on node 844 by one $V_T$. This occurs even faster than the voltage on node 822 falling one $V_T$ below the voltage on node 828 and, therefore, the voltage on node 846 changes at an even faster rate than the voltage change on node 838. This increased slew rate on node 846 is sufficient to drive the input of the CMOS inverter 852 with only minimal current draw when switching.

ASYMMETRIC ONE-SHOT CIRCUITS

The most preferred embodiment of one shot circuits 88 and 90 is described in U.S. patent application Ser. No. 208,288, filed Jun. 17, 1988, entitled DELAY CIRCUIT PROVIDING SEPARATE POSITIVE AND NEGATIVE GOING EDGE DELAYS, which is incorporated herein by reference.

OPERATIONAL SEQUENCE

The address lines and data lines are combined in the PLA array 72 to provide the operational sequence shown in the flow chart of FIG. 5. As shown in FIG. 5 the sequencer 14 begins an update cycle in block 100 by first reading seconds data which corresponds to a present state address of 7A. Following the 7A state the sequencer 14 enters into the 7E state in which it evaluates the seconds data and then performs one of three operations: either to add seven to the seconds data (state 3F) if the seconds data is in BCD format and the time is X9 (e.g. 09,19,29, etc.) but not 59; load 00 into the accumulator if the seconds data is at 59 either in BCD or binary format and go to state 3E; or, if neither of the previous conditions are satisfied, to add one to the seconds data (state 79).

If the sequencer 14 enters state 7F or 3F, then the next operation is a write into the memory of the data on the A bus shown as state 7D. After this write in state 7D the sequencer enters into the alarm sequence shown in FIG. 5E. Thus, in 59 cases out of 60 the sequencer will have progressed from reading the seconds data, updating the seconds data, writing the seconds data back into the common memory, and then entering into the alarm sequence.

If the sequencer enters into state 3E, it then writes 00 seconds data back into the memory and then enters into a precharge cycle 7C. In such a precharge cycle the timekeeping bit lines in the common memory are precharged prior to a read operation and also the minutes address into the memory is selected. The next cycle is a read minutes operation, state 75. The state 75 is followed by a state 77 which is similar to the state 7E for the seconds operation. If the minutes data is at 59 minutes, then 00 is written into the minutes portion of the memory and the memory is again precharged in step 6C and the address is selected in order to read the hours in step 6E. If the minutes data is not 59 minutes, the minutes data is incremented (state 7F or 3F), written into the memory (state 7D), and the sequencer begins the alarm sequence.

After the hours are read, the sequencer enters step 6A which has many options depending on whether the data is binary or BCD, whether the time is for a 12 hour clock or a 24 hour clock, whether the hours are switching from 11 a.m. to 12 p.m., from 11 p.m. to 12 a.m., from 12 p.m. to 1 p.m. or from 12 a.m. to 1 a.m., and whether it is time to switch between standard time and daylight savings time. If the hour data read is not 12:00 a.m., then the hour data is incremented (state 7F or 3F), written into memory (state 7D), and the sequencer begins the alarm sequence.

If the hour is changing to 12:00 a.m., then the sequencer reads the day of the week, updates the day of the week, and reads the date of the month, and, if the date is the last day of the month, updates the date of the month in state 65 to 01 and reads the month data. If the date is not the last day of the month, the date is incremented (state 7F or 3F), written into memory (state 7D), and the sequencer begins the alarm sequence. The date of the month change is determined by the number of days in the particular month and whether the year is a leap year or not.

If the month is changing to January, then the year data is read and updated. If the month read is not December, then the month data is incremented (state 7F or 3F), written into memory (state 7D), and the sequencer begins the alarm sequence. After the year data is updated, the sequencer begins the alarm sequence.

Figure 5A:
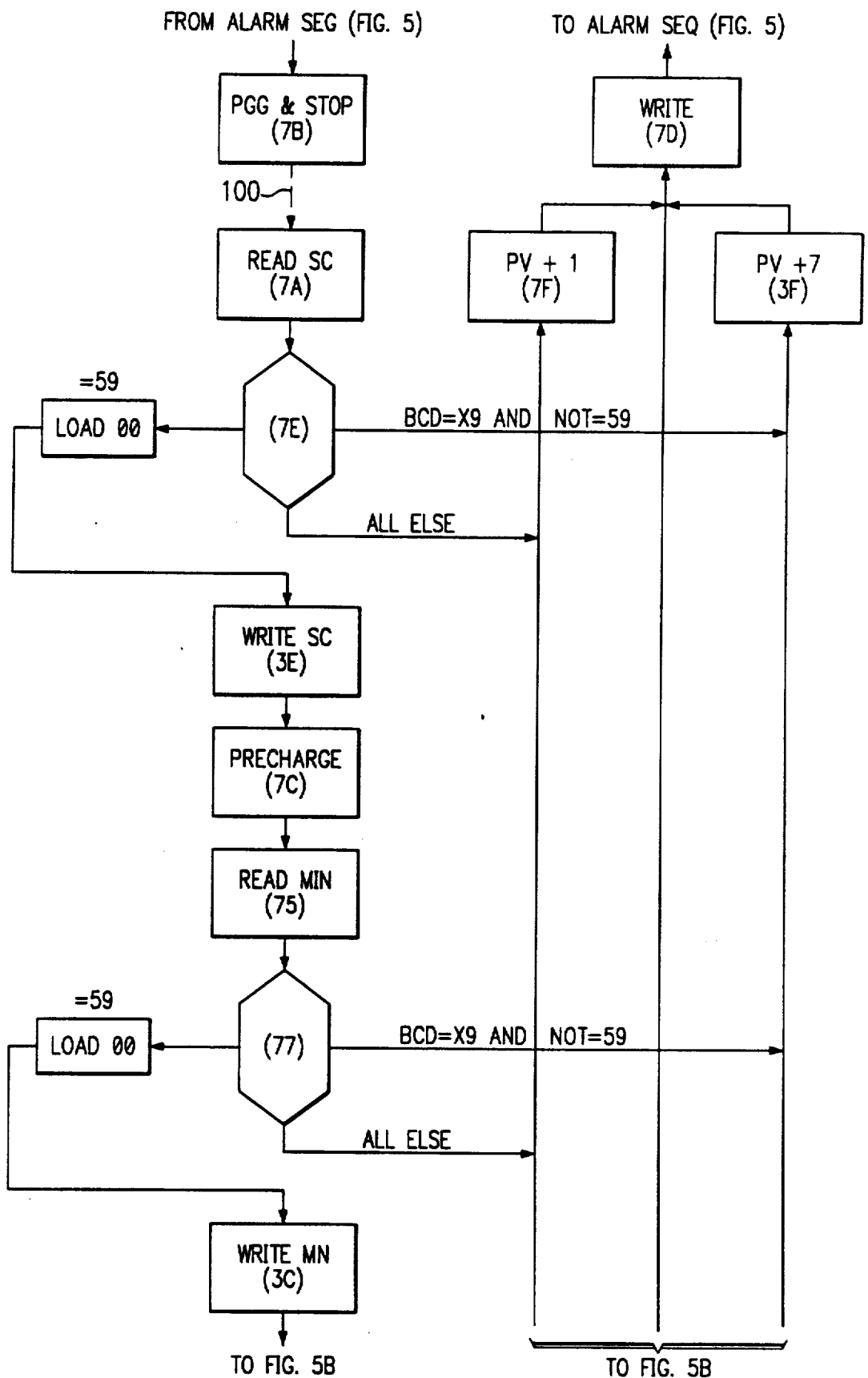
FIG. 5 (comprising FIGS. 5A–5E) is a flow diagram of the timekeeping system according to the present invention.
Figure 5B:
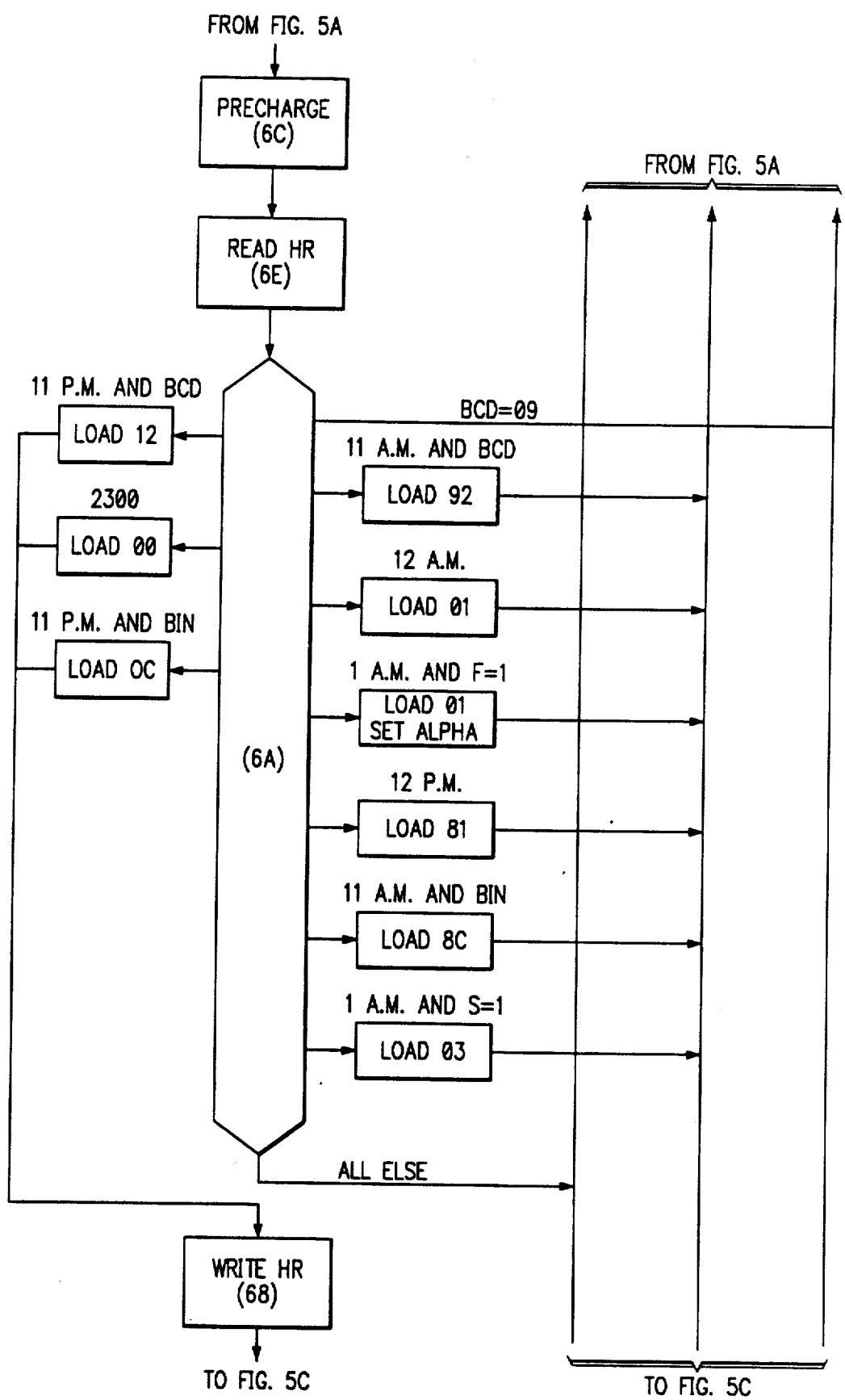
Figure 5C:
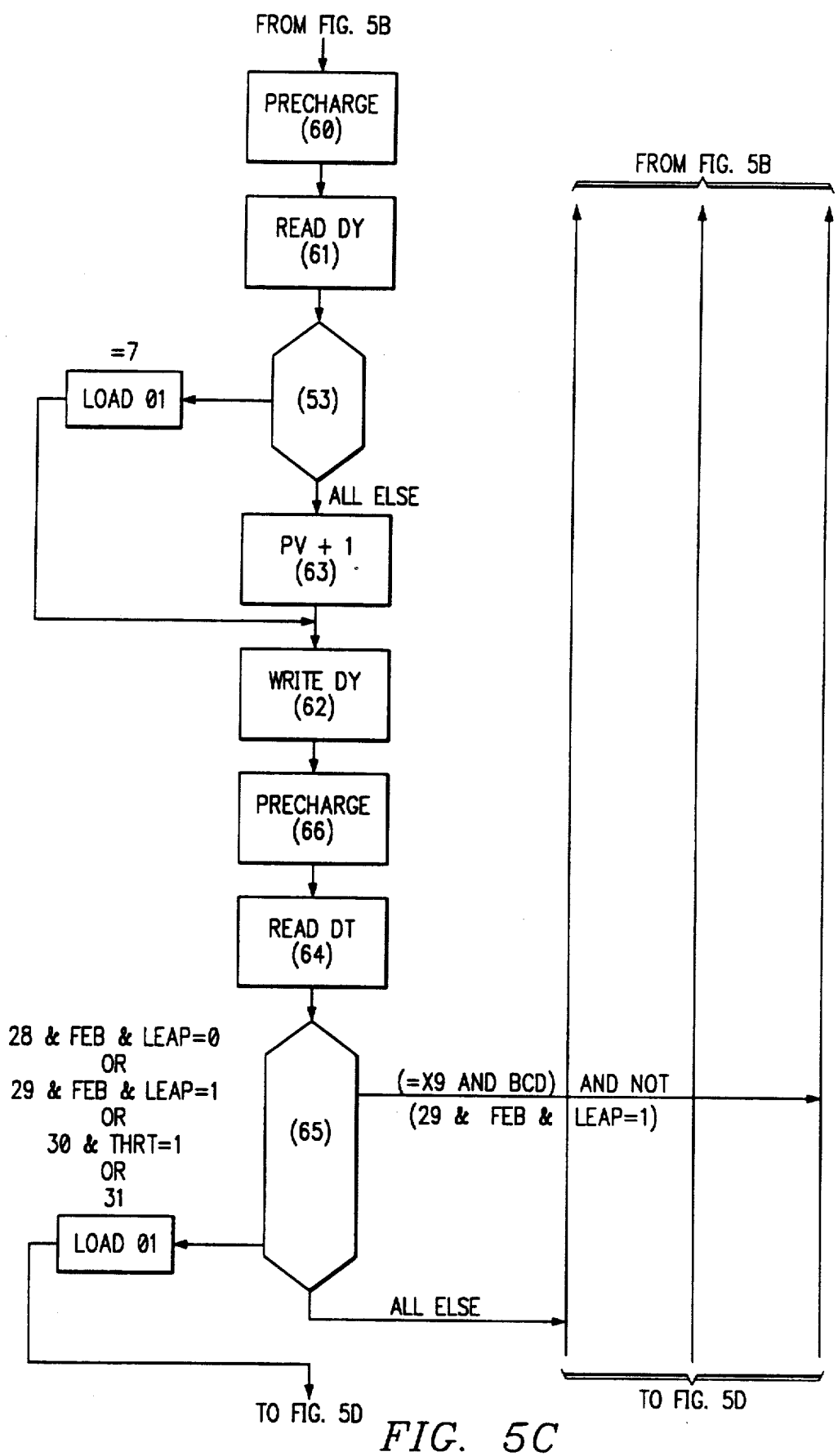
Figure 5D:
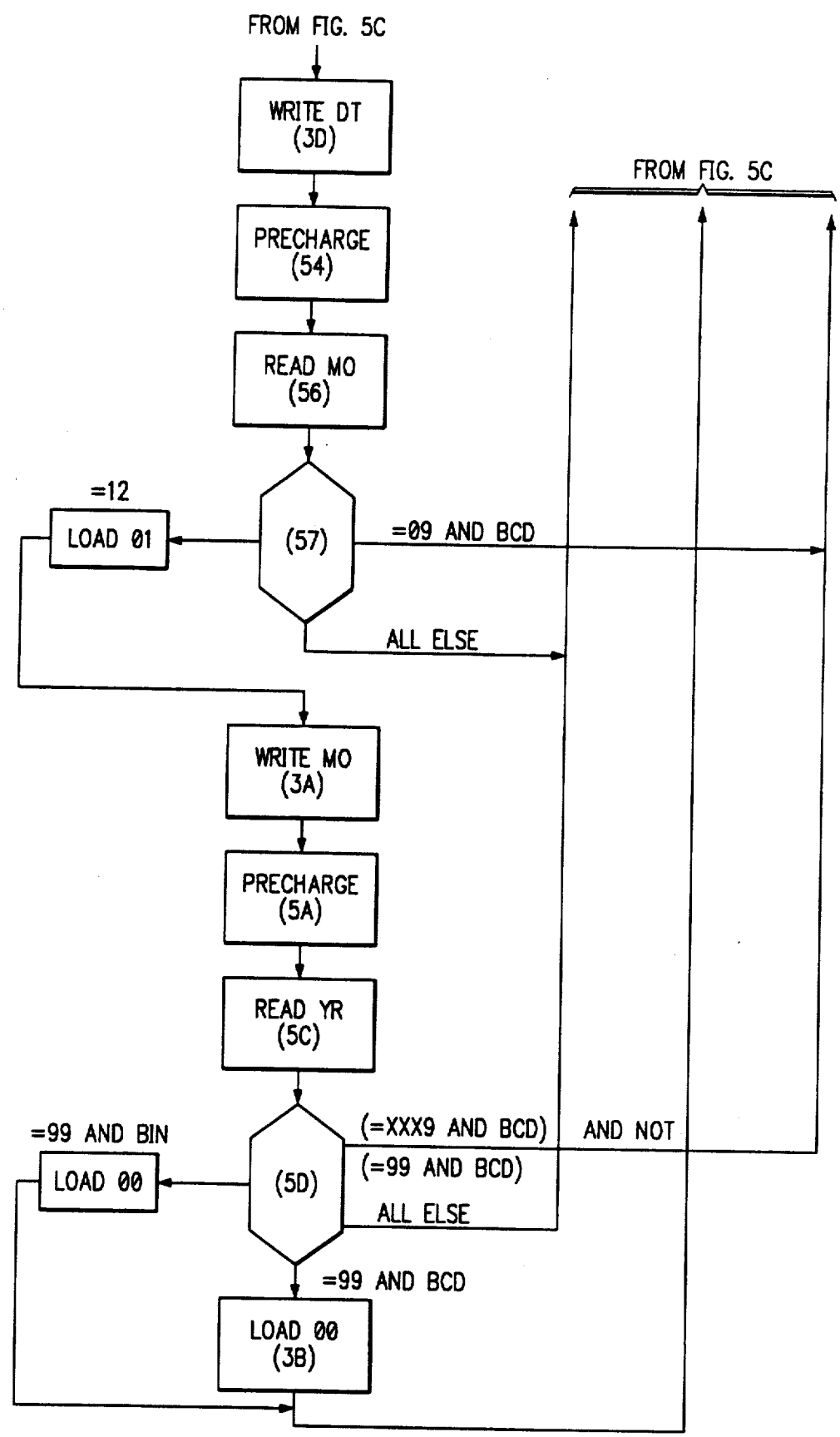
Figure 5E:
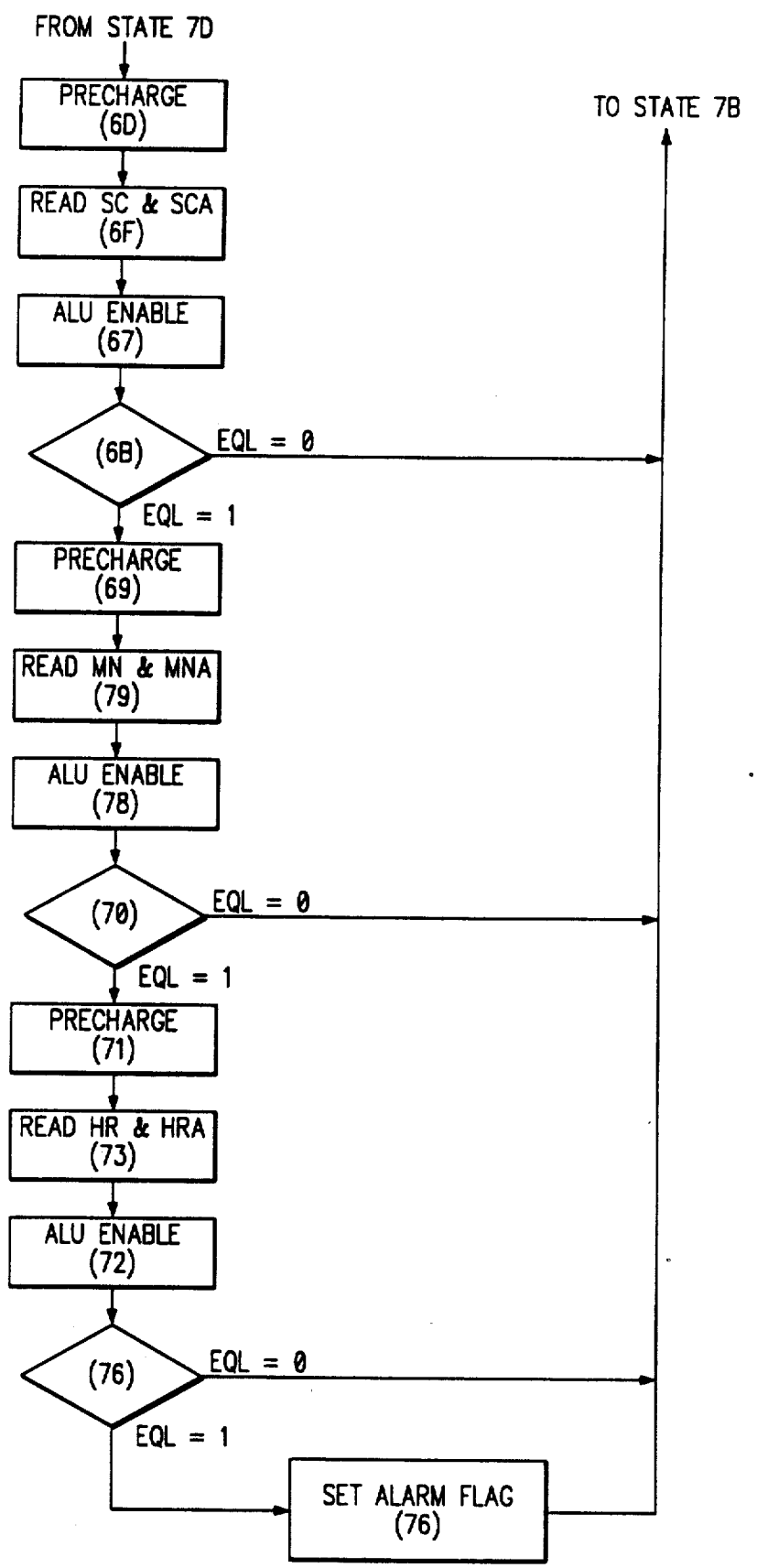

As shown in FIG. 5E the alarm sequence consists of first precharging the timekeeping bit lines in the common memory 20 (step 6D) and then reading the seconds data and the seconds alarm data (step 6F) and then enabling the ALU to compare the data on the A data bus 26 and the B data bus 28. If there is a match in step 6B, then the minutes data and minutes alarm data is read in step 79 and another comparison is made in step 78. If the minutes match, then the hours and the hours alarm data is read and compared and if there is a match at this point, then the alarm flag is set in step 76. Any time a match is not made the sequencer branches to state 7B which precharges the timekeeping bit lines of the common memory, sets the address lines to read the seconds data, and issues a command on data line UDC to cause the oscillator to hold the clock line to the sequencer at a logic 1 level until the next update cycle.

FIG. 6 is a timing diagram showing the clock signal from the oscillator 12 to the sequencer 14 for the first two states of the sequencer 14. At time 110, the signal from the oscillator 12 goes from a logic 1 to a logic 0 after being held high after the last update cycle. This transition at time 110 initiates another update cycle. Prior to time 110, the sequencer 14 is in a precharge operation. At the time 110 the sequencer 14 enters an evaluate cycle and timing signals T1, T2, T1P, and T2P shown in FIG. 6 are generated. The falling edge of the T1 signal generates the T1P signal which latches the data out of the PLA array 72 and the T2P timing pulse is used to control the transmission gates connected to the lines on the A data bus 26 and the B data bus 28. Following the initial evaluate cycle the sequencer 14 enters into another precharge cycle and this process is repeated until the sequencer enters into state 7B at which time it sends a signal to the oscillator to hold the clock line at a logic 1 level until the next update cycle is to begin. In the preferred embodiment the pulse train out of the oscillator 12 into the sequencer 14 shown in FIG. 6 has a frequency of 4096 Hz, the T1 and T2 delay times are on the order of 0.5 microseconds, and the T1P and T2P pulses have a width of about 50 nanoseconds.

Significantly, the data on the A data bus 26 changes only once in 58 out of every 60 update cycles since the sequencer only reads seconds unless the seconds data is at 59 or if the seconds data matches the seconds alarm data. Also after each write operation, the incremented seconds data is written into the memory and immediately written back onto the A data bus by the interface circuit 30 of the common memory 20.

Thus, there has been described a timekeeping system which operates with a minimum number of sequential states and which minimizes the number of logic level changes on the primary data bus to thereby provide a low power timekeeping system in comparison to systems which read all time data on each update cycle or which use approximately the same electrical energy for each update cycle.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly their scope is not limited except by the allowed claims.

What is claimed is:

1. An integrated circuit for timekeeping, comprising:
   a memory;
   a sequencer;
   an arithmetic and logic unit (ALU);
   first and second parallel data busses, both connecting said memory to said ALU;
   wherein said busses are connected to said memory in such relation that said first bus carries time data, and said second bus carries substantially only alarm data;
   wherein said sequencer and said ALU are connected and programmed so that said ALU compares the seconds portion of time data to the seconds portion of alarm data, and additional portions of said time data and said alarm data are fetched if said ALU detects a match between said respective seconds portions;
   and further comprising a clocked latch connected to said first bus, so that said first bus is held at a constant potential except when data on said first bus is required to change.

2. The integrated circuit of claim 1, wherein said memory is dual-ported.

3. The integrated circuit of claim 1, wherein said memory comprises an array of memory cells, and each of said cells is dual-ported.

4. The integrated circuit of claim 1, further comprising an oscillator which is connected to provide a clock signal to said sequencer.

5. The integrated circuit of claim 1, further comprising an oscillator which is connected to provide a clock signal to said sequencer, wherein said clock has a frequency in the neighborhood of 4000 Hz.

6. The integrated circuit of claim 1, wherein said sequencer is a state machine which performs an update cycle each second.

7. The integrated circuit of claim 1, wherein said sequencer is a state machine which performs an update cycle each second, and wherein said update cycle consists of two segments.

8. The integrated circuit of claim 1, wherein said sequencer is a state machine which performs an update cycle each second; and wherein said update cycle consists of two segments, including an update sequence, for updating the time stored in said memory, and an alarm sequence, for comparing the present time to alarm data stored in said memory.

9. The integrated circuit of claim 1, wherein said sequencer is a state machine which performs an update cycle each second; and wherein said update cycle consists of two segments, including an update sequence, for updating the time stored in said memory, and an alarm sequence, for comparing the present time to alarm data stored in said memory, and wherein said update sequence includes the steps of reading the seconds data from said memory, testing the seconds data to see if it reads 59 seconds, incrementing the seconds data, and writing the incremented seconds data back to said memory.

10. The integrated circuit of claim 1, wherein said sequencer is a state machine which performs an update cycle each second; and wherein said update cycle consists of two segments, including an update sequence, for updating the time stored in said memory, and an alarm sequence, for comparing the present time to alarm data stored in said memory; and wherein said update sequence includes the steps of reading the seconds data from said memory, testing the seconds data to see if it reads 59 seconds, incrementing the seconds data, and writing the incremented seconds data back to said memory, and thereafter, if said seconds data was not 59 seconds, then entering into said alarm sequence, and, if the seconds data was 59 seconds, then reading and incrementing minutes data.

11. The integrated circuit of claim 1, wherein said sequencer is a state machine which performs an update cycle each second; and wherein said update cycle consists of two segments, including an update sequence, for updating the time stored in said memory, and an alarm sequence, for comparing the present time to alarm data stored in said memory; and wherein said sequencer is connected and programmed so that, when said sequencer enter said alarm sequence, the present seconds data is compared to the alarm seconds data.

12. An integrated circuit for timekeeping, comprising:
    a memory;
    sequencing logic;
    comparison logic;
    a plurality of data lines connecting said memory to said comparison logic;
    wherein said lines are connected to said memory in such relation that a first set of said lines carries time data, and a second set of said lines carries substantially only alarm data;
    wherein said sequencing logic and said comparison logic are connected and programmed so that said comparison logic compares the seconds portion of time data to the seconds portion of alarm data, and additional portions of said time data and said alarm data are fetched if said comparison logic detects a match between said respective seconds portions; and further comprising a controllable latch connected to said first set of lines, so that said lines of said first set are held at a constant potential except when data on said lines of said first set is required to change.

13. The integrated circuit of claim 12, wherein said comparison logic consists essentially of an arithmetic and logic unit (ALU).

14. The integrated circuit of claim 12, wherein said memory is dual-ported.

15. The integrated circuit of claim 12, wherein said memory comprises an array of memory cells, and each of said cells is dual-ported.

16. The integrated circuit of claim 12, further comprising an oscillator which is connected to provide a clock signal to said sequencing logic.

17. The integrated circuit of claim 12, further comprising an oscillator which is connected to provide a clock signal to said sequencing logic, wherein said clock has a frequency in the neighborhood of 4000 Hz.

18. The integrated circuit of claim 12, wherein said sequencing logic is a state machine which performs an update cycle each second.

19. The integrated circuit of claim 12, wherein said sequencing logic is a state machine which performs an update cycle each second, and wherein said update cycle consists of two segments.

20. The integrated circuit of claim 12, wherein said sequencing logic is a state machine which performs an update cycle; each second; and wherein said update cycle consists of two segments, including an update sequence, for updating the time stored in said memory, and an alarm sequence, for comparing the present time to alarm data stored in said memory.

21. The integrated circuit of claim 12, wherein said sequencing logic is a state machine which performs an update cycle each second; and wherein said update cycle consists of two segments, including an update sequence, for updating the time stored in said memory, and an alarm sequence, for comparing the present time to alarm data stored in said memory; and wherein said update sequence includes the steps of reading the seconds data from said memory, testing the seconds data to see if it reads 59 seconds, incrementing the seconds data, and writing the incremented seconds data back to said memory.

22. The integrated circuit of claim 12, wherein said sequencing logic is a state machine which performs an update cycle each second; and wherein said update cycle consists of two segments, including an update sequence, for updating the time stored in said memory, and an alarm sequence, for comparing the present time to alarm data stored in said memory; and wherein said update sequence includes the steps of reading the seconds data from said memory, testing the seconds data to see if it reads 59 seconds, incrementing the seconds data, and writing the incremented seconds data back to said memory, and thereafter, if said seconds data was not 59 seconds, then entering into said alarm sequence, and, if the seconds data was 59 seconds, then reading and incrementing minutes data.

23. The integrated circuit of claim 12, wherein said sequencing logic is a state machine which performs an update cycle each second; and wherein said update cycle consists of two segments, including an update sequence, for updating the time stored in said memory, and an alarm sequence, for comparing the present time to alarm data stored in said memory; and wherein said sequencer is connected and programmed so that, when said sequencer enters said alarm sequence, the present seconds data is compared to the alarm seconds data.

* * * * *